United States Patent [19]
Yamauchi et al.

[11] Patent Number: 5,181,188
[45] Date of Patent: Jan. 19, 1993

[54] SEMICONDUCTOR MEMORY DEVICE

[75] Inventors: Yoshimitsu Yamauchi; Kenichi Tanaka, both of Nara; Keizo Sakiyama, Kashihara; Katsumi Fukumoto, Nara, all of Japan

[73] Assignee: Sharp Kabushiki Kaisha, Abeno, Japan

[21] Appl. No.: 549,293

[22] Filed: Jul. 6, 1990

[30] Foreign Application Priority Data

| Jul. 7, 1989 | [JP] | Japan | 1-176844 |
| Jul. 25, 1989 | [JP] | Japan | 1-191930 |
| Sep. 18, 1989 | [JP] | Japan | 1-243162 |
| Oct. 19, 1989 | [JP] | Japan | 1-273038 |
| Feb. 23, 1990 | [JP] | Japan | 2-043391 |

[51] Int. Cl.$^5$ .................................... G11C 14/00
[52] U.S. Cl. ............................ 365/228; 365/185; 365/149
[58] Field of Search ............... 365/149, 185, 228, 203

[56] References Cited

U.S. PATENT DOCUMENTS

| 5,063,425 | 11/1991 | Yamauchi et al. | 357/23.6 |
| 5,065,201 | 11/1991 | Yamauchi | 357/23.5 |
| 5,075,888 | 12/1991 | Yamauchi et al. | 365/228 |

OTHER PUBLICATIONS

Yamauchi et al., "A Novel NVRAM Cell Tech. for High Density Applic.," Int. Electron Devices Mtg., (1988).

Primary Examiner—Joseph A. Popek
Attorney, Agent, or Firm—Morrison & Foerster

[57] ABSTRACT

A semiconductor memory device having memory cells in which a DRAM section and an EEPROM section are combined, and a transistor for transferring data between the DRAM and EEPROM sections is disclosed. The DRAM section includes a MOS transistor, and a capacitor one electrode of which is connected to the source of the MOS transistor. The EEPROM section has a floating gate transistor. The transistor for transfer is connected between the source of the MOS transistor and the source/drain of the floating gate transistor. The control gate of the floating gate transistor is connected to the source of the MOS transistor. Methods of rewriting and recalling data in the semiconductor memory device are also disclosed. The methods can be performed without shortening the life of the EEPROM section.

18 Claims, 15 Drawing Sheets

| | DRAM DATA | EEPROM SECTION | EEPROM DATA |
|---|---|---|---|
| STEP 1 | "0" |  | ERASE STATE |
| | "1" |  | |
| STEP 2 | "0" |  | WRITE STATE |
| | "1" |  | ERASE STATE |

| OPERATION MODE | | APPLIED BIAS | | | | |
|---|---|---|---|---|---|---|
| | | 1 | 2 | 6 | 7 | 8 |
| WRITE OF DRAM | | Vcc/0 | 0 | Vsg | 0 | 0 |
| REWRITE OF EEPROM | STEP 1 | 0 | 0 | 0 | 0 | Vpp |
| | STEP 2 | 0 | Vpp | 0 | 0 | 0 |
FIG.5A
| WRITE OF DRAM | Vcc/0 | OPEN | Vsg | V7 | 0 |
|---|---|---|---|---|---|
| DRAM→EEPROM | 0 | V2 | 0 | V7 | 0 |
FIG.5B
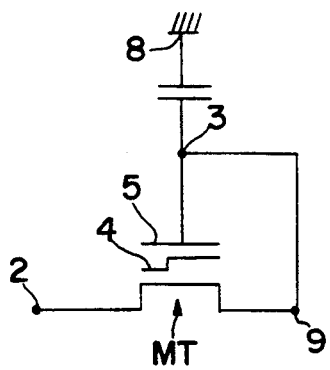
FIG.6
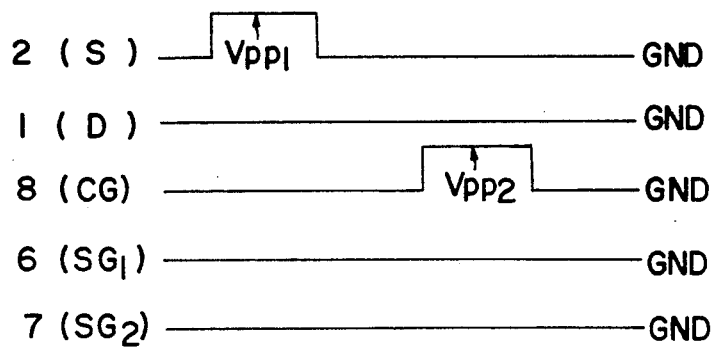
FIG.7

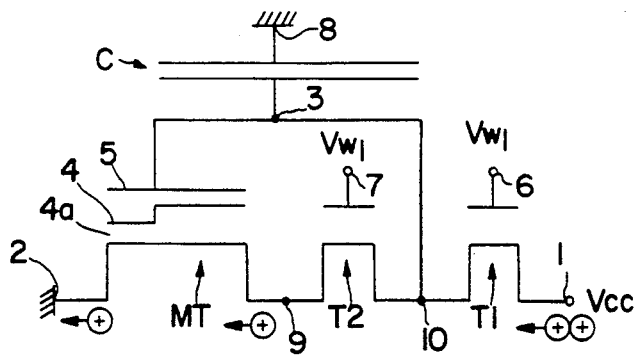
FIG. 11A
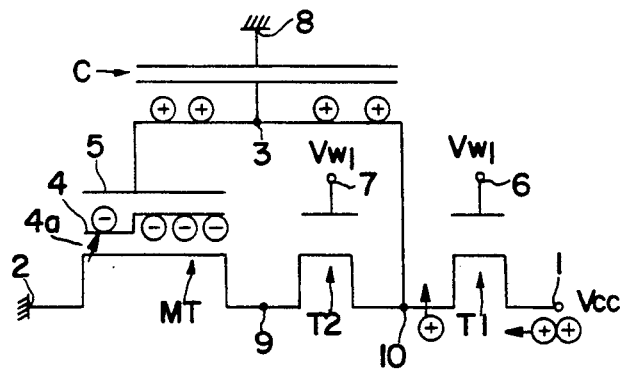
FIG. 11B
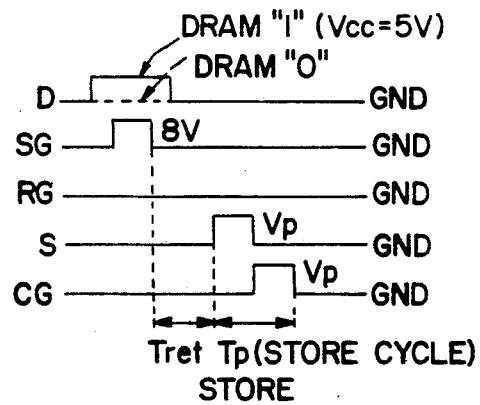
FIG. 12A
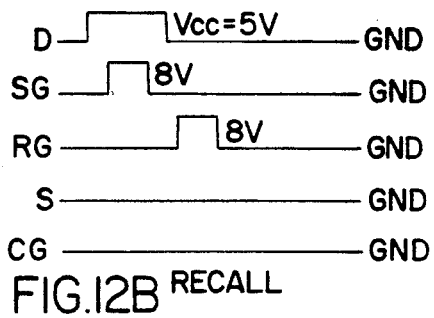
FIG. 12B RECALL

SEMICONDUCTOR MEMORY DEVICE

BACKGROUND OF THE INVENTION

1. Field of the Invention:

This invention relates to a semiconductor memory device, and more particularly to a semiconductor memory device having a volatile memory means and a non-volatile memory means. This invention also relates to data rewrite and data recall methods performed in the semiconductor memory device.

2. Description of the Prior Art

Semiconductor memory devices of the prior art include a mask ROM (Read-Only Memory), an EEPROM (Electrically Erasable Programmable Read-Only Memory) and other types of non-volatile memory devices which retain their storage contents even when the power is off, and a DRAM (Dynamic Random-Access Memory) and other volatile memory devices which lose their storage contents when the power is off.

Non-volatile memory devices, a mask ROM and EEPROM are capable of retaining stored data for a long period of time after the power is cut off. However, in the case of a mask ROM, data cannot be rewritten after it has been written in a wafer process. In the case of an EEPROM, data can be rewritten after it has been arranged in an apparatus, but the period for data write/erase is as long as 10 ms and there is a limit to the number of possible write/erase cycles, so these devices are not suitable to applications in which data is repeatedly rewritten.

In a volatile memory, a DRAM, on the other hand, the period for data write is less than 100 ns and there is no limit to the number of rewrite cycles, but when the power is off, stored data are lost.

FIG. 28 shows a conventional semiconductor memory device having a memory cell in which a DRAM section and an EEPROM section EM are combined. In the device shown in FIG. 28, the memory cell is connected to a pair of bit lines (a control gate line CG and a bit line B) with the result in that a increased area is required. Because the source of a MOS transistor $Tr_{14}$ is connected to Vcc, the operation of reading the threshold voltage Vth (low state) of the EEPROM section EM requires a considerably prolonged period of time, and the potential difference between the bit lines is small.

SUMMARY OF THE INVENTION

The semiconductor memory device of this invention, which overcomes the above-discussed and numerous other disadvantages and deficiencies of the prior art, comprises a volatile memory means and a non-volatile memory means, said volatile memory means comprises a MOS transistor, and a capacitor means, one electrode of said capacitor means being connected to the source of said MOS transistor, said non-volatile memory means comprises a floating gate transistor, said semiconductor memory device further comprises a switch means connected between said source of said MOS transistor and the source/drain of said floating gate transistor, the control gate of said floating gate transistor being connected to said source of said MOS transistor.

A method of rewriting data in the above semiconductor memory device according to the invention comprises the steps of: (a) making said MOS transistor and said switch means off; (b) in the case that data stored in said volatile memory means is "0", changing, when the threshold voltage of said floating gate transistor is in a high state, the threshold voltage to a low state, and maintaining, when the threshold voltage of said floating gate transistor is in a low state, the state of the threshold voltage; and (c) in the case that data stored in said volatile memory means is "1", changing, when the threshold voltage of said floating gate transistor is in a low state, the threshold voltage to a high state, and maintaining, when the threshold voltage of said floating gate transistor is in a high state, the state of the threshold voltage.

Alternatively, in step (b) of the above method, a pulse voltage is applied between the other electrode of said capacitor means and the other source/drain of said floating gate transistor, thereby making the potential level of said other source/drain higher than that of said other electrode.

In step (c) of the above method, a pulse voltage may be applied between the other electrode of said capacitor means and the other source/drain of said floating gate transistor, thereby making the potential level of said other source/drain lower than that of said other electrode.

A method of recalling data in the above semiconductor memory device according to the invention comprises the steps of: (a) setting the conduction state of said floating gate transistor in accordance with the threshold voltage of floating gate transistor; and (b) returning data which has been written in said non-volatile memory means to said volatile memory means depending on the conduction state of said floating gate transistor.

Alternatively, in step (a), when the threshold voltage of said floating gate transistor is lower than the potential of said control gate, the conduction state of said floating gate transistor is set to be conductive, and when the threshold voltage of said floating gate transistor is higher than the potential of said control gate, the conduction state of said floating gate transistor is set to be nonconductive.

Futhermore, in step (b), at least one of said MOS transistor and said switch means may be made off, thereby eliminating a DC path from the drain of said MOS transistor.

Another a semiconductor memory device according to the invention comprises: a plurality of memory cells each of which includes a volatile memory means having a capacitor means, a non-volatile memory means having a floating gate transistor, and a switch means for transferring data between said volatile memory means and said non-volatile memory means; and a plurality of bit lines to which said memory cells are connected; a plurality of word lines which function as word electrodes common to said memory cells, the control gate of said floating gate transistor is integrated with the electrode of said capacitor means, said electrode being connected to the side of said bit lines, said device further comprises: a means for, when data stored in said non-volatile memory means is to be transferred to said volatile memory means, setting the potential of the source of said floating gate transistor to the ground level; and a means for, when data stored in said non-volatile memory means is to be transferred to said volatile memory means, setting the potential of one of bit lines forming a bit line pair to which one the selected memory cell is connected to the power source level or the vicinity thereof, and, after setting the potential of the other bit line to an intermediate potential, connecting said non-volatile memory means to said bit line, and, thereafter, electrically separating said non-volatile memory means from said bit line, and amplifying the potential difference between said bit line pair.

Said control gate and said electrode may be made of polysilicon.

A further semiconductor memory device according to the invention comprises: a plurality of memory cells each of which includes a volatile memory means having a capacitor means, a non-volatile memory means having a floating gate transistor, and a switch means for transferring data between said volatile memory means and said non-volatile memory means; and a plurality of bit lines to which said memory cells are connected; a plurality of word lines which function as word electrodes common to said memory cells, the control gate of said floating gate transistor is integrated with the electrode of said capacitor means, said electrode being connected to the side of said bit lines, said device further comprises: a means for, when data stored in said non-volatile memory means is to be transferred to said volatile memory means, setting the potential of the source of said floating gate transistor to the ground level; and a means for, when data stored in said non-volatile memory means is to be transferred to said volatile memory means, setting the potential of all of said volatile means to the power source level or the vicinity thereof, and thereafter making switch means on.

Said control gate and said electrode may be made of polysilicon.

A further semiconductor memory device according to the invention comprises: memory cells having a volatile memory means, a non-volatile memory means and a switch means which is conductive during recall operation; bit line pairs connected to said memory cells; a pullup transistor drive control signal line; sense amplifiers having a p-channel MOS transistor connected between said bit line pair and said pullup transistor drive control signal line; a bit line charging circuit for, before recall operation, charging said bit line pairs to an intermediate potential which is between the power source level and the ground level, and thereafter charging the bit line to which the selected memory cell is connected to the power source level; and a sense amplifier drive circuit for lowering the potential of said bit line from the power source level to the intermediate potential plus the threshold voltage of said p-channel MOS transistor.

Alternatively, said sense amplifier drive circuit, before recall operation, charges said pullup transistor drive control signal line to the intermediate potential, and maintains the potential of said pullup transistor drive control signal line at the intermediate potential or the vicinity thereof, thereby discharging electric charge of said bit line charged to the power source level, to said pullup transistor drive control signal line via said p-channel MOS transistor.

Said device may perform recall operation when each of said bit lines are electrically separated from said pullup transistor drive control signal line.

A further semiconductor memory device according to the invention comprises: memory cells having a volatile memory means, a non-volatile memory means and a switch means which is conductive during recall operation; bit line pairs connected to said memory cells; a pullup transistor drive control signal line; a pulldown transistor drive control signal line; a sense amplifier drive circuit for, before recall operation, charging said pullup transistor drive control signal line and said pulldown transistor drive control signal line to an intermediate potential; and a bit line charging circuit for, before recall operation, charging said bit line pairs to an intermediate potential which is between the power source level and the ground level, and thereafter charging the bit line to which the selected memory cell is connected to the power source level; and sense amplifiers having: a pair of pullup p-channel MOS transistors one terminal of which is connected to said pullup transistor drive control signal line; a pair of pulldown n-channel MOS transistors one terminal of which is connected to said pulldown transistor drive control signal line; and a pair of separation p-channel MOS transistors which is connected between other terminals of said pullup transistor drive control signal line and pulldown transistor drive control signal line, the junctions of said separation p-channel MOS transistors and pulldown n-channel MOS transistors being respectively connected to said bit line pairs.

Alternatively, wherein, before recall operation, said bit line charging circuit charges said bit line pairs to the intermediate potential, and thereafter charges the bit line to which the selected memory cell is connected to the power source level while said separation p-channel MOS transistors are in the off state, and then recall operation starts.

Thus, the invention described herein makes possible the objectives:

(1) providing a semiconductor memory device in which data can be rewritten rapidly, and stored data can be retained for a long period of time in the absence of power supply;

(2) providing a semiconductor memory device in which data can be rewritten without restriction in the number of rewriting cycles;

(3) providing a method of rewriting data in a semiconductor memory device which can be performed without shortening the life of a non-volatile memory means in the memory device;

(4) providing a method of recalling data from a non-volatile memory means to a volatile means;

(5) providing a semiconductor memory device in which the data recall from a non-volatile memory means from a volatile memory means can be rapidly conducted;

(6) providing a semiconductor memory device in which the potential of a bit line can be made sufficiently higher;

(7) providing a semiconductor memory device which requires a reduced area;

(8) providing a semiconductor memory device in which recall operation can be conducted during a reduced period of time; and (9) providing a semiconductor memory device in which bit lines can be electrically separated from each other during recall operation.

BRIEF DESCRIPTION OF THE DRAWINGS

This invention may be better understood and its numerous objects and advantages will become apparent to those skilled in the art by reference to the accompanying drawings as follows:

FIGS. 5A and 5B show various bias conditions in the device of FIG. 1.

FIG. 6 is a circuit diagram illustrating the EEPROM section of the device of FIG. 1.

FIG. 7 is a timing chart illustrating a method of rewriting data according to the invention.

FIGS. 11A and 11B are diagrams illustrating a method of recalling data according to the invention.

FIGS. 12A and 12B are diagrams illustrating another method of recalling data.

DESCRIPTION OF THE PREFERRED EMBODIMENTS

Figure 1:
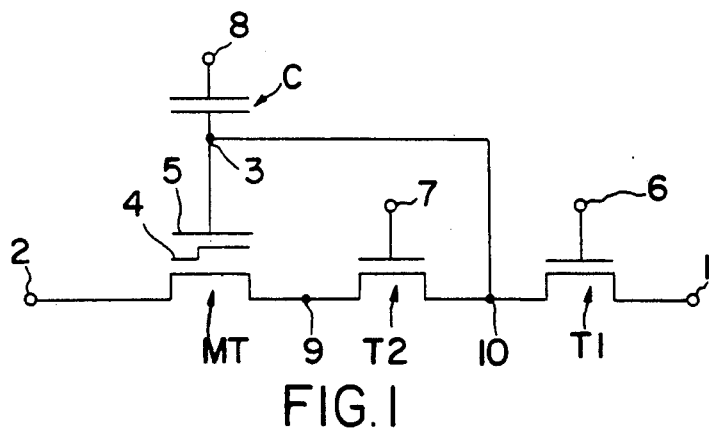
FIG. 1 is a circuit diagram showing a semiconductor memory device according to the invention.

FIG. 1 shows a semiconductor memory device according to the invention. The semiconductor memory device of FIG. 1 has a DRAM section DM comprising one MOS transistor T1 and one capacitor C, and an EEPROM section EM comprising a floating gate transistor MT. The source 10 of the transistor T1 is connected to the accumulation node 3 of the capacitor C, and the drain 9 of the transistor MT is connected to the accumulation node 3 via a mode selector transistor T2 which functions as a switch means. The control gate 5 of the transistor MT is also connected to the accumulation node 3. The transistor T2 is switched on or off by applying a positive bias voltage V7 or a zero bias on the gate terminal (mode selector gate) 7.

Figure 2:
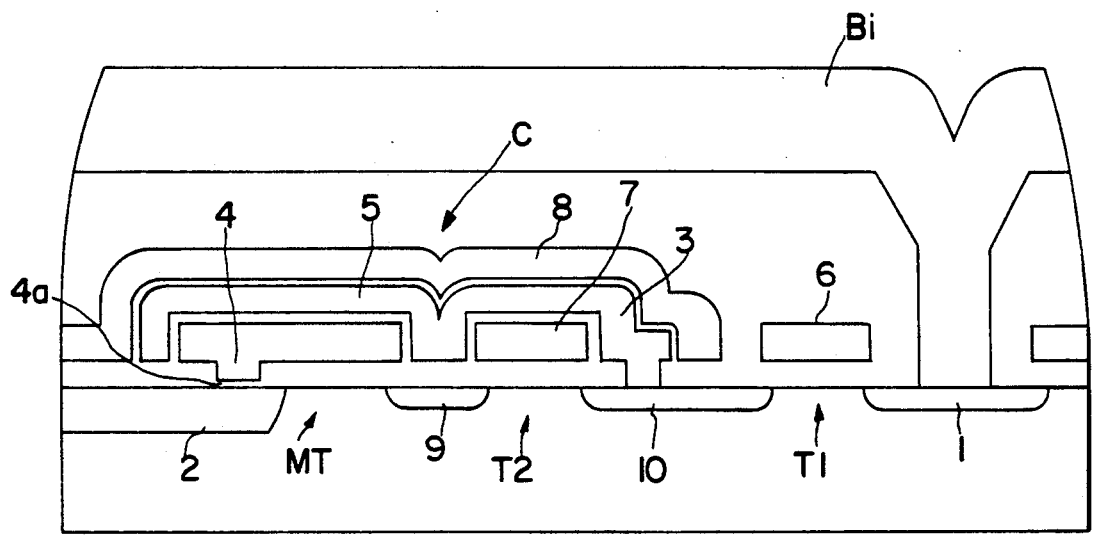
FIG. 2 shows a sectional view of the device of FIG. 1.

FIG. 2 shows a cross sectional view of the device of FIG. 1. As shown in FIG. 1, the source 2 and drain 9 of the transistor MT are diffused areas which are formed below the floating gate 4. Between the source 2 and the floating gate 4, a tunnel oxide film 4a is disposed. The gate electrode 6 of the transistor T1 is connected to a word line, and the drain 1 is connected to a bit line $B_i$.

This semiconductor device operates as follows when the transistor T2 is off, i.e., when the mode selector gate 7 is zero biased.

Figure 3:
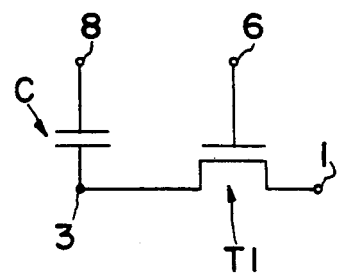
FIG. 3 is a circuit diagram illustrating the DRAM section of the device of FIG. 1.
Figure 4:
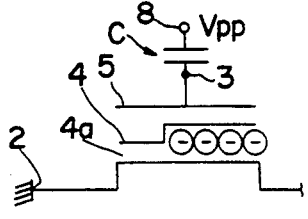
FIG. 4 shows the operation of the device of FIG. 1.
Figure 4:
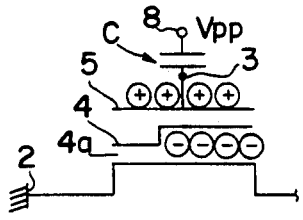
Figure 4:
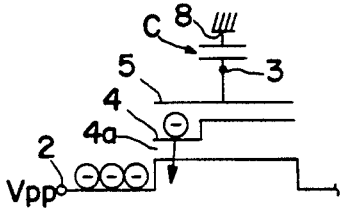
Figure 4:
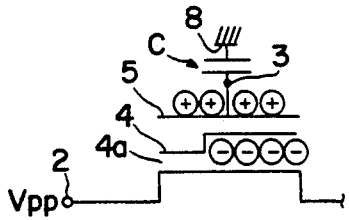

(1) First, as shown in FIG. 3, the DRAM section DM is electrically isolated. When data is to be written into the DRAM section DM, a cell selector gate voltage Vsg is applied to the gate terminal 6 to turn on the transistor T1, and the power source voltage Vcc or zero bias is applied to the drain terminal 1, as shown in the top row of FIG. 5A. In response to the above, the potential of the accumulation node 3 becomes Vcc or 0. That is, the data in the DRAM section DM becomes "1" or "0".

(2) When data is written into the EEPROM section EM, as shown in the middle row of FIG. 5A, first the gate terminal 6 and drain terminal 1 of the transistor T1 are zero biased to disable the DRAM section DM, and the source terminal 2 of the transistor MT is zero biased while the program voltage Vpp is applied to the other electrode (plate electrode) terminal 8 of the capacitor C. Then, electrons accumulate in the floating gate 4 through the tunnel oxide film 4a regardless of whether the data in the DRAM section DM is "0" or "1", and the threshold value of the transistor T2 becomes high (erase state), as shown in the column "step 1" of FIG. 5A. At this time, the charges of the accumulation node 3 of the capacitor C do not escape since the transistor T2 is in the off state, so the data stored in the DRAM section DM does not change when the EEPROM section EM goes to the erase state. However, the capacitance of the capacitor C must be designed sufficiently large compared to the gate capacitances $C_{52}$ (capacitance between the terminal 5 and the terminal 2) and $C_5$ (capacitance between the terminal 5 and the substrate) of the transistor MT.

Then, as shown in the bottom row of FIG. 5A, the potential of the source terminal 2 of the transistor MT is made to the program voltage Vpp while the plate electrode 8 of the capacitor C is zero biased. The storage contents of the EEPROM section EM change corresponding to the data state "0" or "1" of the DRAM section DM. For the sake of explanation, the coupling ratio Rc of the transistor MT is defined by the following expression:

$$Rc = \frac{C_{45}}{C_{42} + C_{45} + C_4}$$

where $C_{45}$ is the capacitance between the floating gate 4 and the control gate 5, $C_4$ is the capacitance between the floating gate 4 and the substrate, and $C_{42}$ is the capacitance between the floating gate 4 and the source 2. Then, the voltage applied to the tunnel oxide film 4a is:

(a) when the DRAM data is "0", $V_0 (= Rc \cdot Vpp)$; or
(b) when the DRAM data is "1", $V_1 (= Rc(Vpp - Vcc))$.

That is, when the DRAM data is "0", a voltage which is higher by $$\Delta V = V_0 - V_1 = Rc \cdot Vcc$$

than in the case when the DRAM data is "1" is applied to the tunnel oxide film 4a.

In the case of (a) (when the DRAM data is "0"), the electrons accumulated in the floating gate 4 are pulled toward the source 2 since the voltage applied to the tunnel oxide film 4a is high. As a result, even if the potential of the floating gate 4 becomes high and the transistor MT turns to the on state, the electrons do not flow to the drain 9 since the transistor T2 is in the off state. In this way, many electrons are pulled away and the threshold value of the transistor MT becomes low (write state).

In the case of (b) (When the DRAM data is "1"), electrons remain accumulated in the floating gate 4 since the voltage applied to the tunnel oxide film 4a is low. Therefore, the threshold value of the transistor MT remains high (erase state).

In this way, the storage contents of the EEPROM section EM can be set to a write state (low threshold value) or erase state (high threshold value) in accordance with "0" or "1" of the data contents of the DRAM section DM, while the data contents of the DRAM section DM are retained.

Next, the on state of the transistor T2, i.e., the state wherein a positive bias V7 is applied to the mode selection gate 7 will be described.

(3) As shown in the top row of FIG. 5B, the DRAM section DM operates in the same way as in the off state described above by setting the source terminal 2 of the transistor MT to the open state and zero biasing the plate terminal 8 of the capacitor C.

(4) When data is to be written into the EEPROM section EM, the drain terminal 1 and cell selection gate terminal 6 of the transistor T1 are zero biased to disable the DRAM section DM, as shown in the bottom row in FIGS. 5B and 6, a bias V2 for transfer is applied to the source terminal 2 of the transistor MT while the plate terminal 8 of the capacitor C is zero biased.

As in the case that the transistor T2 is in the off state, the storage contents of the EEPROM section EM can be set to the write state or the erase state in accordance with the DRAM data "0" or "1". As shown in the equivalent circuit of FIG. 6, the drain 9 of the transistor MT is connected to the accumulation node 3 of the capacitor C, so that the charge of the accumulation node 3 is lost during the write operation through the drain 9 of the transistor MT. That is, the DRAM data is not retained, and transferred to the EEPROM section EM.

In this way, the semiconductor memory device of the embodiment operates as a DRAM capable of continually rewriting data at high speed, and is able to transfer data from a DRAM section DM to an EEPROM section EM, and also to rewrite EEPROM data while retaining DRAM data. Furthermore, even when the power is off, this device can store data as an EEPROM over a long period of time, thus giving it a wide range of applicability.

In the above-described process of rewriting storage contents of the EEPROM section EM so as to comprise with the DRAM data when the transistor T2 is off, the EEPROM section EM must be set to the erase state once, and thereafter, irrespective of the DRAM data "0" or "1", the EEPROM section EM is set to the write state or the erase state in accordance with the DRAM data (hereinafter, this operation is referred to as "backup"). As compared with the process in which the EEPROM section can be directly changed to the write erase state without passing the erase state, resulting in that the rewriting process requires useless writing steps. Therefore, the life of the EEPROM, which is restricted in the number of rewriting, is shorten, with the result in that the reliability of an LSI incorporating the above-described semiconductor memory device may be suffered.

A method of rewriting data in the semiconductor memory device of FIG. 1 will be described. FIG. 7 shows the timing of the voltages applied to on the terminals 2, 1, 8, 6 and 7 when rewriting the EEPROM section EM of the device. The drain (D) terminal 1 and gate electrode ($SG_2$) terminal 6 of the transistor T1 are continuously grounded during the period of rewriting in order to disable the DRAM section DM, while the mode selection gate ($SG_1$) 7 of the transistor T2 is grounded to make the transistor T2 off, thereby preventing the charge in the accumulation node 3 of the capacitor C from escaping. First, the plate electrode (CG) terminal 8 of the capacitor C is maintained in the grounded state, and a pulse voltage $V_{pp1}$ is applied to the source (S) terminal 2 of the transistor MT (step 1). Thereafter, the source terminal 2 is maintained at the grounded state, and the pulse voltage $V_{pp2}$ is applied to the plate electrode terminal 8 (step 2). When the pulse voltages $V_{pp1}$ and $V_{pp2}$ are impressed, a high electric field is applied to the tunnel oxide film 4a, resulting in that a current is caused to flow as a result of Fowler-Nordheim tunneling. This tunnel current Ifn can be related to the shift in the threshold voltage Vth of the EEPROM section EM as follows.

The tunnel current Ifn injected from the source 2 to the floating gate 4 via the tunnel oxide film 4a is $$|Ifn| = S \cdot A \cdot Eox \cdot Eox \cdot \exp(-B/|Eox|) \qquad (1)$$

where S is the area of the tunnel, A and B are constants, Eox is the electric field (tunnel electric field) applied to the tunnel oxide film 4a. When the pulse voltage $V_{pp1}$ is applied, Eox > 0 and Ifn > 0, and when the pulse voltage $V_{pp2}$ is applied, Eox < 0 and Ifn < 0.

Assuming the tunnel electric fields corresponding to the DRAM data "1" and "0", i.e., the presence or absence of charges in the accumulation node 3 are $Eo_1$ and $Eo_0$, the difference $\Delta Eo$ in the above-mentioned tunnel electric fields becomes $$Eo = Eo_1 - Eo_0 \approx \frac{-Vcc/Tox}{1 + \left(\frac{Ci + Cs}{Ci \cdot Cs}\right)Cfs} \qquad (2)$$

where Tox is the thickness of the tunnel oxide film 4a, Ci is the capacitance between the accumulation node 3 and the floating gate 4, Cs is the storage capacitance of the DRAM section DM, and Cfs indicates the capacitance due to overlapping of the floating gate 4 and the source 2. Expression (2) shows that the difference $\Delta Eo$ in the tunnel electric fields when the DRAM data is "1" and when it is "0" is negative.

The positive charge $\Delta Q_f$ which migrates to the floating gate 4 is indicated by $$\Delta Qf = Ifn \cdot \Delta t \qquad (3)$$

where $\Delta t$ is the period of time when the pulse voltage is applied.

The change ΔVth in the threshold voltage Vth of the EEPROM section EM due to the above charge migration is $$\Delta Vth = -\Delta Qf / Ci \quad (4)$$

In this way, a relationship is established between the tunnel current Ifn in expression (1) and the change in the threshold voltage Vth. The tunnel current Ifn is strongly dependent on the tunnel electric field Eox, and even a small increase in the electric field due to the DRAM data of "0" or "1" will cause the tunnel current to increase greatly. Below are explanations of each case.

Figure 8A:
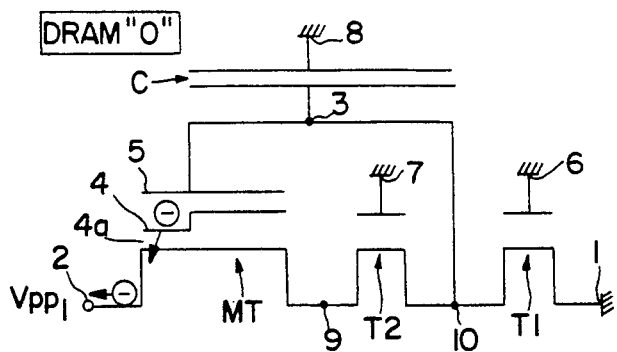
FIGS. 8A to 8D are diagrams illustrating the method of rewriting data shown in FIG. 7.
Figure 8B:
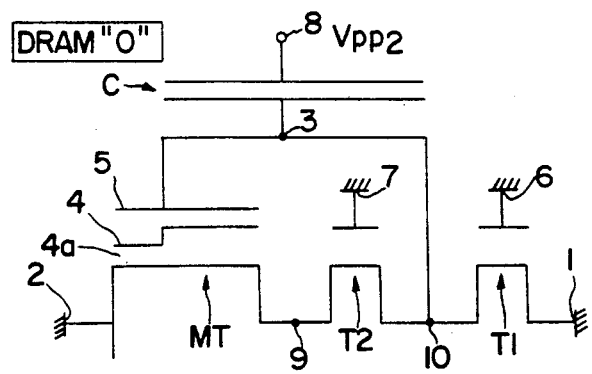
Figure 8C:
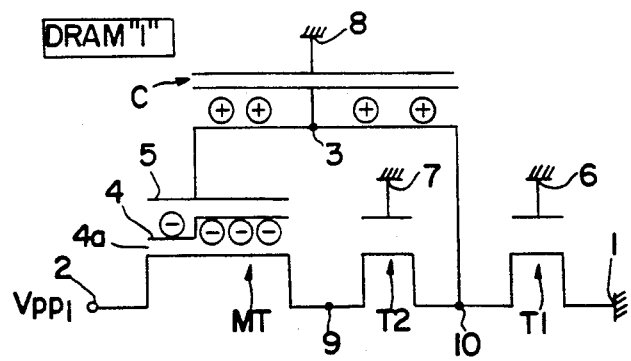
Figure 9:
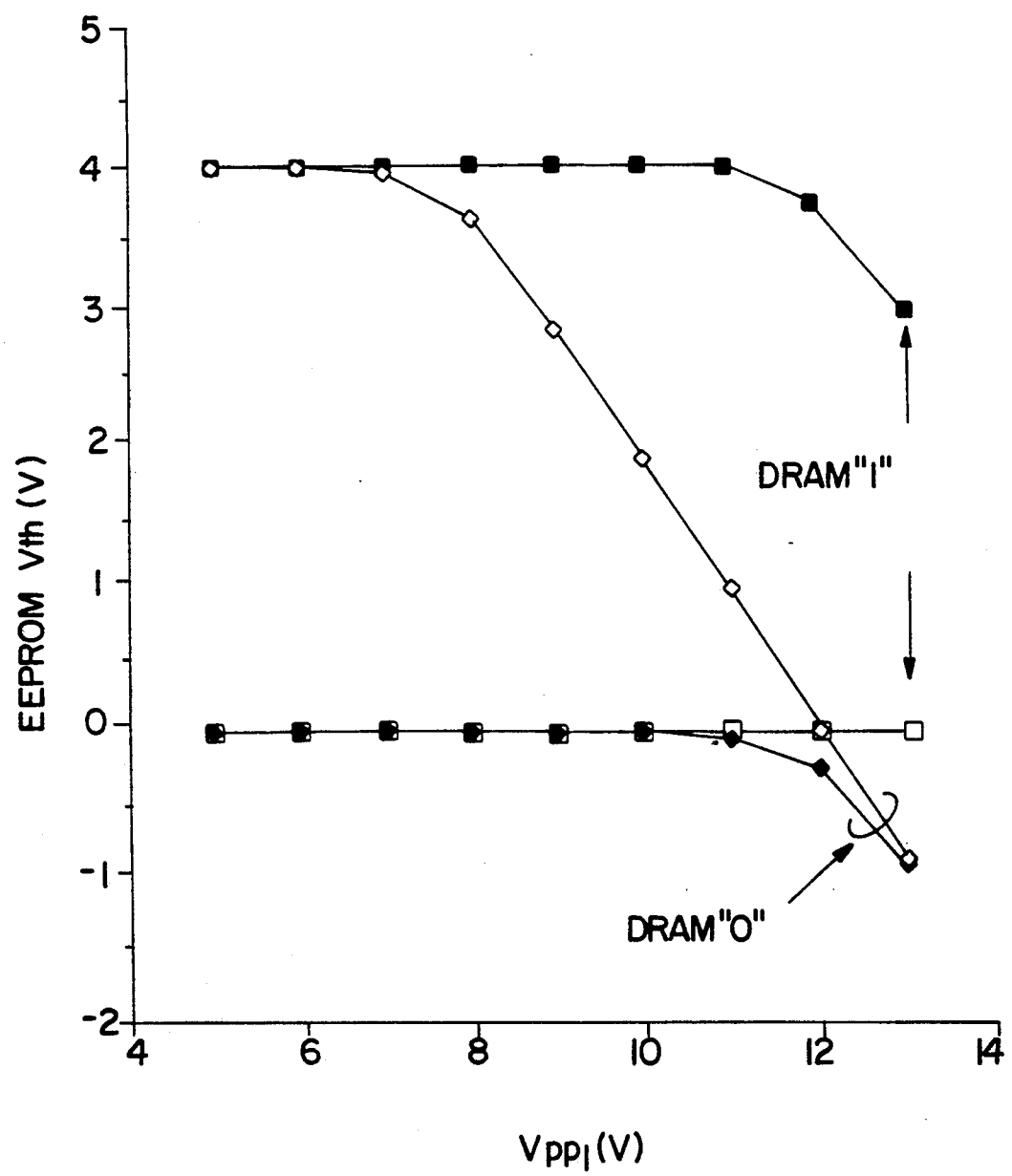
FIGS. 9 and 10 show the variations of the threshold voltage of the EEPROM section caused by applying pulse voltages.

(1) In step 1 (Eox>0), the tunnel current Ifn is extremely small when the DRAM data is "1", so that there is almost no change in the threshold voltage Vth of the EEPROM section EM (FIG. 8C). In contrast, when the DRAM data is "0", an electric field which is higher by |ΔEo| is impressed, and the tunnel current in the positive direction increases markedly, resulting in a negative shift in the threshold voltage Vth of the EEPROM section EM (FIG. 8A). Actual calculated results are shown in FIG. 9. This will be described in more detail below. In FIG. 9, solid lozenges indicate values obtained when the DRAM data is "0" and the initial threshold voltage Vth is low, open lozenges those obtained when the DRAM data is "0" and the initial threshold voltage Vth is high, solid squares those obtained when the DRAM data is "1" and the initial threshold voltage Vth is high, and open squares those obtained when the DRAM data is "1" and the initial threshold voltage Vth is low.

(i) The DRAM data is "0".

When the initial threshold voltage Vth of the EEPROM section EM is 4.0 V (high state), the threshold voltage Vth decreases as the pulse voltage Vpp₁ increases. The threshold voltage Vth of the EEPROM section EM becomes less than 0.04 V when Vpp₁ ≧ 12 V, so that it begins to agree with the result when the initial Vth=0, irrespective of the initial state.

(ii) The DRAM data is "1".

When the pulse voltage Vpp₁ is lower than 12 V, the change in the threshold voltage Vth of the EEPROM section EM is small, resulting in Vth ≧ 3.72 V.

Figure 8D:
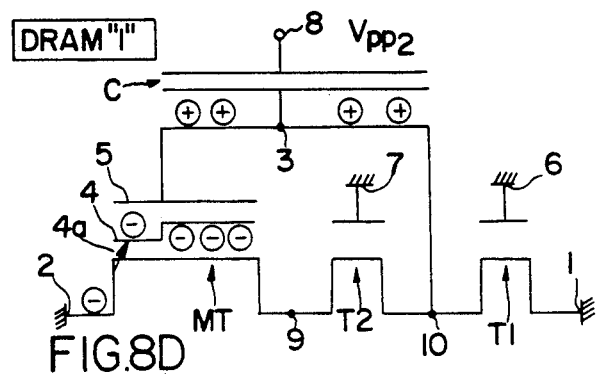
Figure 10:
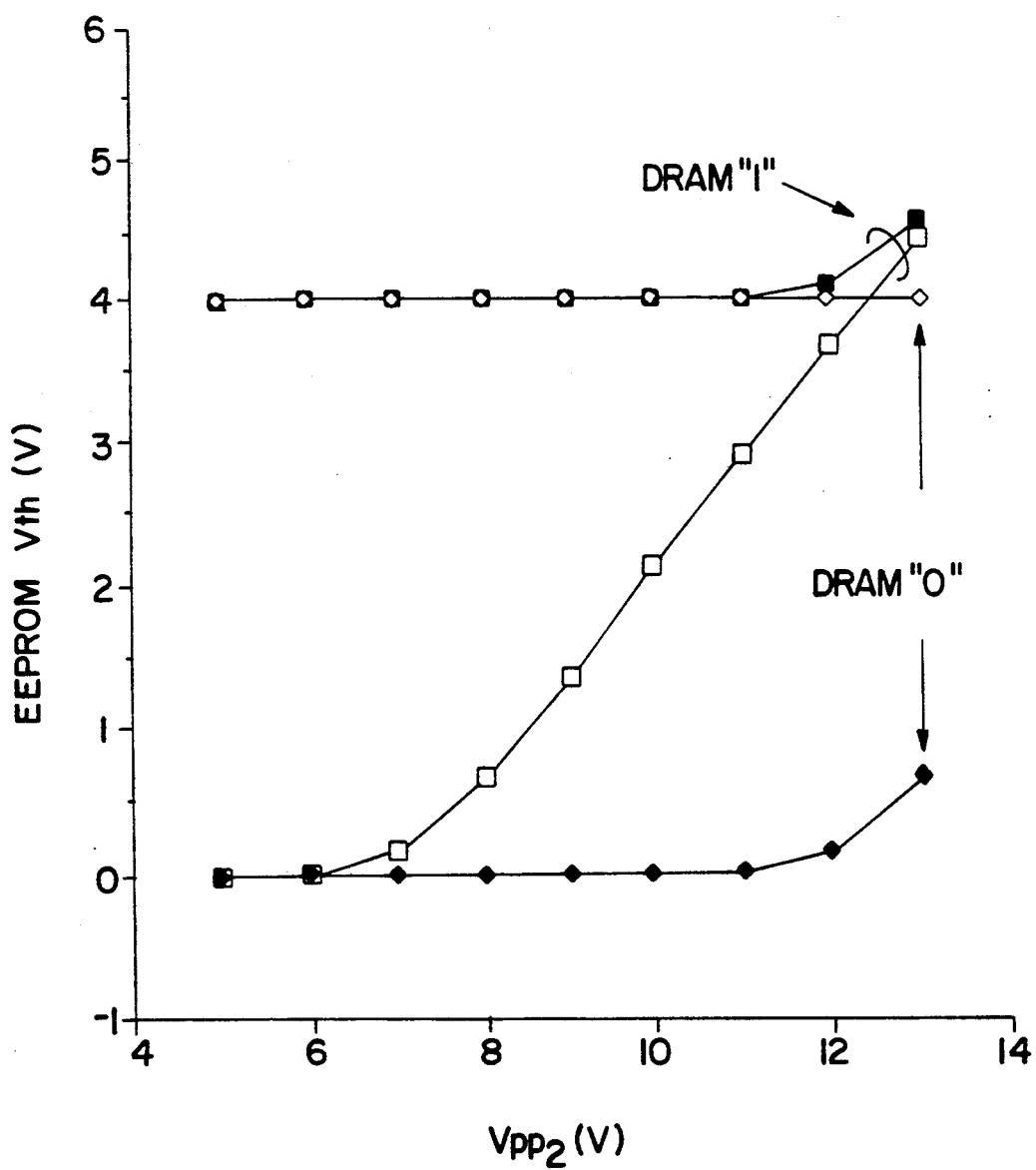

(2) In step 2 (Eox<0), the tunnel current |Ifn| is extremely small when the DRAM data is "0", so that there is almost no change in the threshold voltage Vth of the EEPROM section EM (FIG. 8B). In contrast, when the DRAM data is "1", an electric field which is higher by |ΔEo| is impressed, and the tunnel current in the negative direction increases markedly, resulting in a positive shift in the threshold voltage Vth of the EEPROM section EM (FIG. 8D). Actual calculated results are shown in FIG. 10. This will be described in more detail below. The lozenges and squares in FIG. 10 have the same meaning as those in FIG. 9.

(i) The DRAM data is "0".

When, after step 1, the initial threshold voltage Vth of the EEPROM section EM is low or 0 V, the change in Vth is small when the pulse voltage Vpp₂ ≦ 12 V, resulting in Vth ≦ 0.15 V.

(ii) The DRAM data is "1".

When the initial threshold voltage Vth of the EEPROM section EM is 0 V, the threshold voltage Vth becomes high as the pulse voltage Vpp₂ increases. The threshold voltage Vth is higher than 3.68 V when the pulse voltage Vpp₂ ≧ 12 V, thus beginning to agree with the result when the initial threshold voltage Vth=4.0 V, irrespective of the initial state.

In this way, the shift in the threshold voltage Vth of the EEPROM section EM which is caused in response to the DRAM data state of "0" or "1" becomes a valid value for reading data in the EEPROM section EM and recalling it to the DRAM section DM.

As described above, in the case that the DRAM data is "0", in step 1, when the threshold voltage Vth of the EEPROM section EM is in a high state, the state of Vth is changed to a low state, while, when the threshold voltage Vth is at a low state, the state of Vth is unchanged (i.e., remains in a low state). In step 2, when the threshold voltage Vth is in a low state, the state of Vth is not changed. Therefore, the number of times of rewriting data in the EEPROM section EM can be reduced as compared to in the case in which the low state threshold voltage Vth is temporarily raised to a high state and then changed back to a low state. Namely, in the above-described method of rewriting data, useless rewriting data in the EEPROM section EM can be eliminated.

When the DRAM data is "1", on the other hand, the threshold voltage Vth of the EEPROM section EM is not changed in step 1. In step 2, when the threshold voltage Vth is in a low state, the state of Vth is changed to a high state while, when the state of the threshold voltage Vth is at a high state, the state of Vth remains in a high state. Therefore, the number of times of rewriting the data is the same as in the case in which the low state threshold voltage Vth must be temporarily raised to a high state. Consequently, when performing the backup against the EEPROM section EM, the number of times when the EEPROM section EM, must be rewritten can be lowered overall, thus improving the reliability when the semiconductor memory device is incorporated in an LSI.

Of course, it is possible to impress the pulse voltages Vpp₁ and Vpp₂ in steps 1 and 2 in the reverse order.

Data written in the EEPROM section EM can be recalled the DRAM section DM as follows. First, as shown in FIGS. 11A and 11B, with the plate electrode 8 and source terminal 2 grounded, the bit line B$_i$ connected to the drain 1 of the transistor T1 is precharged (voltage Vcc). Then, the voltage Vw₁ (Vw₁ ≧ 7 V when Vcc = 5 V) is applied to the cell selection gate 6 and the mode selection gate 7, respectively, thus switching on the transistors T1 and T2. When the threshold voltage Vth of the EEPROM section EM is in a low state, the positive charge accumulated in the bit line B$_i$ is pulled from the side of the drain terminal 1 to the side of the source terminal 2 via the respective channels of the transistors T1, T2 and MT. As this occurs, the voltage of the accumulation node 3 drops until it agrees with the threshold voltage Vth of the EEPROM section EM, and the DRAM data becomes "0". The transistors T1 and T2 can be switched on simultaneously, or the transistor T1 can be switched on first and then the transistor T2 switched on after a charge has accumulated in the accumulation node 3. When the threshold voltage Vth of the EEPROM section EM is in a high state, as shown in FIG. 11B, the positive charge accumulated in the bit line B$_i$ accumulates in the accumulation node 3 since the transistor MT is off, so the DRAM data becomes "1". In this way, data written in the EEPROM section EM can be recalled to the DRAM section DM.

When recalling data, one or both of the transistors T1 and T2 can be turned off. Therefore, it possible to eliminate a DC path from the drain of the transistor T1.

FIGS. 12A and 12B show other ways of storing and recalling data in the memory device.

Figure 13:
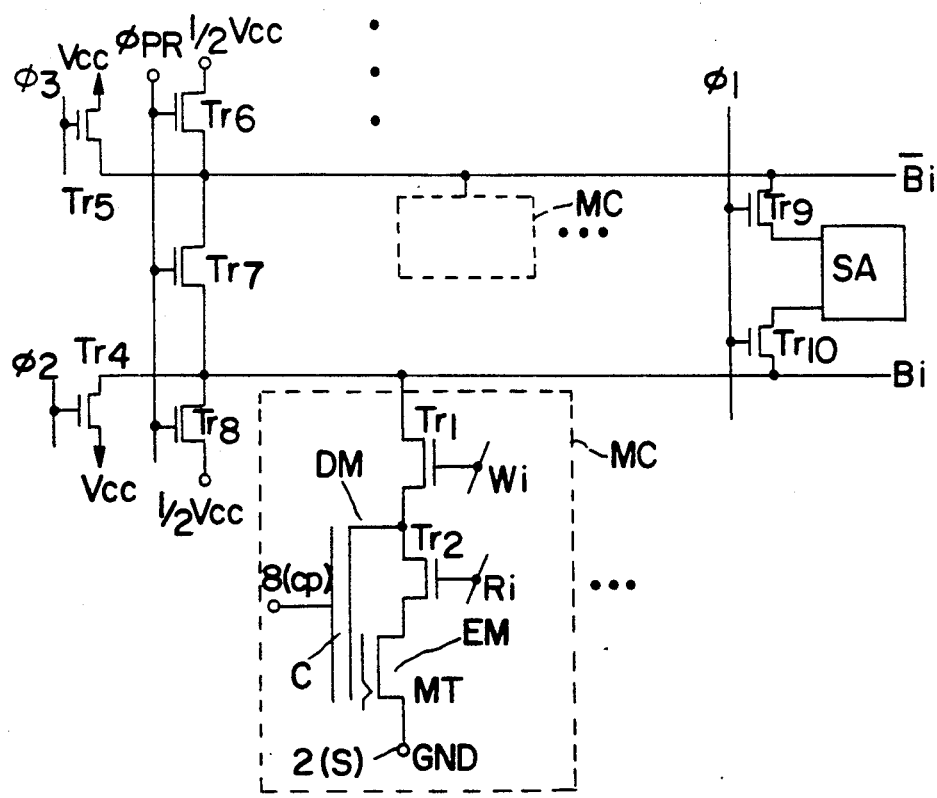
FIG. 13 is a circuit diagram showing another semiconductor memory device according to the invention.

FIG. 13 shows a semiconductor memory device according to the embodiment. The memory device of FIG. 13 comprises a plurality of memory cells MC, and a plurality of bit line pairs $B_i$, /$B_i$ connecting the memory cells. The memory cells MC have the structure shown in FIG. 1. The gate of the transistor $Tr_1$ is connected to the word line $W_i$, and the gate of transistor $Tr_2$ to the recall line $R_i$. When the EEPROM data is recalled to the DRAM section DM, the source 2 of the floating gate transistor MT is set to the ground level GND.

Figure 14:
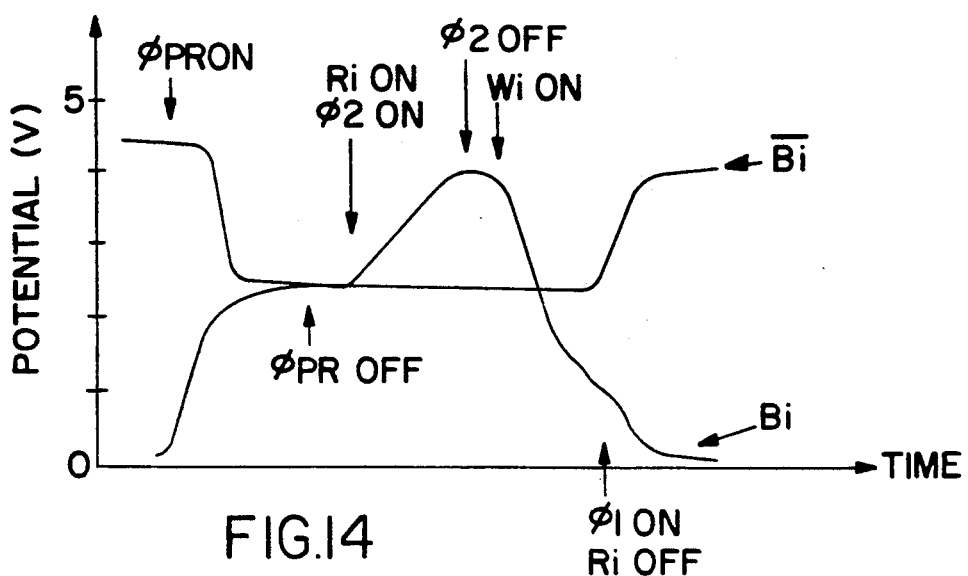
FIG. 14 shows the potential variation of the bit line pair in the device of FIG. 13.

FIG. 14 shows the potential variation of the bit line pair. When the EEPROM data is transferred to the DRAM section DM (recall operation), the bit line pair $B_i$, /$B_i$ is set to the intermediate potential Vcc/2 during the precharge period ($\phi_{PR}$→high, MOS transistors $Tr_6$, $Tr_7$ and $Tr_8$ are turned on). Thereafter, a MOS transistor $Tr_4$ is turned on ($\phi_2$→high). The source of the MOS transistor $Tr_4$ is connected to the bit line $B_i$ to which the selected memory cell MC is connected, and the drain of the transistor $Tr_4$ to the power source voltage Vcc. After the potential of the bit line $B_i$ is raised to the vicinity of the power source voltage, the MOS transistor $Tr_4$ is turned off. Then, the transistor $Tr_1$ of the selected memory cell MC becomes on ($W_i$→high), and a potential the level of which corresponds to the EEPROM data appears across the DRAM section DM and the bit line $B_i$. The transistor $Tr_2$ of the selected memory cell MC is turned off ($R_i$→low), and a sense amplifier SA begins to amplify the potential difference between the bit line pair $B_i$, /$B_i$ ($\phi_1$→high, MOS transistors $Tr_9$ and $Tr_{10}$ are on). The transistor $Tr_2$ of the selected memory cell MC maintains the on state from the time when the transistor $Tr_4$ has turned on and to the time when the transistor $Tr_1$ turns on, and turns off before the commencement of the differential amplification of the bit line pair.

The relation between the DRAM data "1" or "0" and the high level of low level of the threshold voltage Vth is summarized in Table 1 below.

TABLE 1

| DRAM data | Vth of EEPROM section |
|---|---|
| 1 (Vcc) | High |
| 0 (GND) | Low |

In the memory device of FIG. 13, recall operation may be performed in the following operation timing.

(1) The potential of the bit line pair $B_i$, /$B_i$ is set to Vcc/2.

(2) The potential of the selected bit line is raised, and the transistor $Tr_1$ is turned on.

(3) The transistor $Tr_4$ (or $Tr_5$) for raising the potential of a bit line is turned off, and the transistor $Tr_2$ is turned on, thereby changing the potential of the bit line.

(4) The transistor $Tr_2$ is turned off to commence the differential amplification.

When the mode selector gate 7 (FIG. 2) is formed by the two-layer metallization structure, the time constant of the recall line $R_i$ is reduced so that the above-described recall operation can be conducted effectively.

During recall operation, it may be possible that a boost voltage higher than Vcc is applied to the word line $W_i$ and the recall line $R_i$. In this case, the charge of the bit line can easily escape therefrom, resulting in that the period of recall operation can be shortened.

In the above-described embodiment, the turn on or off of the transistors $Tr_6$, $Tr_7$, $Tr_8$, $Tr_4$ ($Tr_5$) and $Tr_2$, and the operation of the sense amplifier SA connected to the bit line pair are repeated for each word lines. In the embodiment, therefore, the period of recall operation may be somewhat prolonged.

An embodiment of the invention which can eliminate the above-mentioned drawback will be described. In this embodiment, when the EEPROM data is transferred to the DRAM section DM (recall operation), the source 2 of the floating gate transistor MT is set to the ground level. In recall operation, the bit line pair $B_i$, /$B_i$ is set to the vicinity of Vcc during the precharge period ($\phi_2$ and $\phi_3$→high, MOS transistors $Tr_4$ and $Tr_5$ are turned on). Thereafter, the transistor $Tr_1$ of the selected memory cell MC becomes on ($W_i$→high), and the potential of the DRAM section DM is set to the vicinity of Vcc. The transistor $Tr_1$ of the selected memory cell MC becomes off ($W_i$→low). During the above, the transistor $Tr_2$ remains off ($R_i$=low). The above processes are repeated to set all of the DRAM sections to the vicinity of Vcc. Then, the transistors $Tr_2$ of all memory cells MC are turned on simultaneously, or sequentially in the unit of predetermined blocks, so that the potential of the DRAM section DM is set to that corresponding to the threshold voltage Vth of the EEPROM section EM, thereby completing recall operation. During recall operation, the charge of the bit line pair is not discharged to the ground GND.

Figure 15:
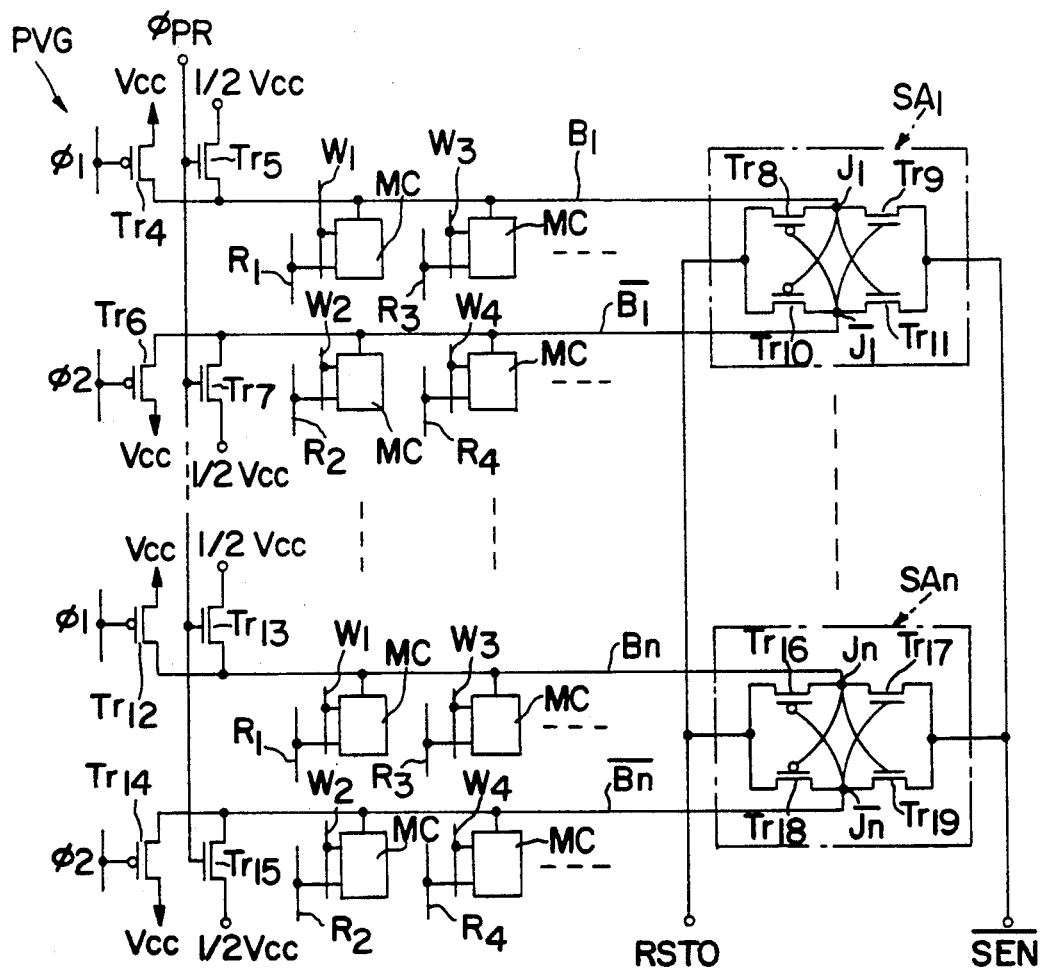
FIG. 15 is a circuit diagram showing a further semiconductor memory device according to the invention.

FIG. 15 shows another semiconductor memory device according to the invention. The device of FIG. 15 comprises multiple memory cells MC, multiple bit line pairs $B_1$, /$B_1$, . . . , $B_n$, /$B_n$ connecting these memory cells MC, a bit line charging circuit PVG, and sense amplifiers $SA_1$, . . . , $SA_n$ for each of the bit line pairs. A pullup transistor drive control signal line RSTO and pulldown transistor drive control signal line /SEN are connected to the sense amplifiers. The control signal lines RSTO and /SEN are voltage controlled by a sense amplifier drive circuit 200 shown in FIG. 17. Each memory cell MC has a configuration in which the DRAM section DM comprising an n-channel MOS transistor $Tr_1$ and a capacitor C and the EEPROM section EM comprising a floating gate transistor MT are connected via a transistor $Tr_2$ for transfer. The bit line charging circuit PVG comprises n-channel MOS transistors $Tr_5$, $Tr_7$, . . . $Tr_{13}$ and $Tr_{15}$ which receive the intermediate potential Vcc/2 through one terminal and are controlled by the control signal $\phi$PR, and p-channel MOS transistors $Tr_4$, $Tr_6$, . . . $Tr_{12}$ and $Tr_{14}$ which receive the power source potential Vcc through one terminal and are controlled by the control signal $\phi_1$ or $\phi_2$.

The sense amplifier $SA_1$ on the bit line pair $B_1$, /$B_1$ comprises a pair of p-channel MOS transistors $Tr_8$ and $Tr_{10}$ connected to the pullup transistor drive control signal line RSTO, and a pair of n-channel MOS transistors $Tr_9$ and $Tr_{11}$ connected to the pulldown transistor drive control signal line /SEN. The transistors $Tr_8$ and $Tr_9$, and the transistors $Tr_{10}$ and $Tr_{11}$ are connected by the respective junctions $J_1$ and /$J_1$, and the respective bit lines $B_1$ and /$B_1$ are connected to these junctions $J_1$ and /$J_1$. Each gate of the transistors $Tr_{10}$ and $Tr_{11}$ is connected to the junction $J_1$, and each gate of the transistors $Tr_8$ and $Tr_9$ is connected to the junction /$J_1$. The other sense amplifiers have the same configuration, that is, the sense amplifier $SA_n$ on the bit line pair $B_n$ and $/B_n$ comprises a pair of p-channel MOS transistors $Tr_{16}$ and $Tr_{18}$ and a pair of n-channel MOS transistor pair $Tr_{17}$ and $Tr_{19}$. The threshold voltage Vthp of each of the p-channel MOS transistors $Tr_8$, $Tr_{10}$, ..., $Tr_{16}$ and $Tr_{18}$ is $0<|Vthp|<Vcc/2$.

Figure 17:
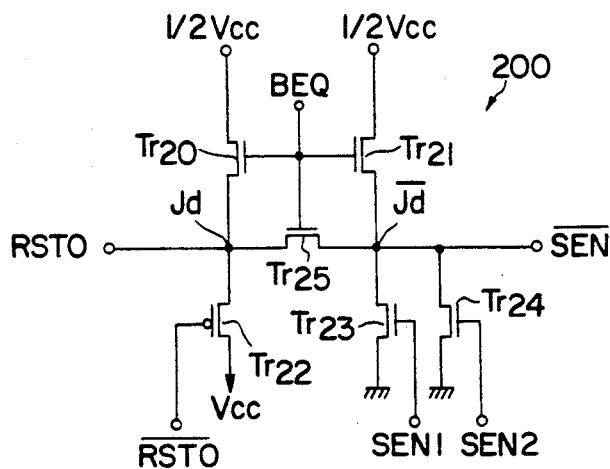
FIG. 17 is a circuit diagram showing a sense amplifier used in the device of FIG. 15.

As shown in FIG. 17, the sense amplifier drive circuit 200 comprises a pair of n-channel MOS transistors $Tr_{20}$ and $Tr_{21}$ which receive the intermediate potential Vcc/2 through one terminal, and an n-channel MOS transistor $Tr_{25}$ connected between the opposite terminals of the transistors $Tr_{20}$ and $Tr_{21}$. The same control signal BEQ is applied to the gate of each of the transistors $Tr_{20}$, $Tr_{21}$ and $Tr_{25}$. The pullup transistor drive control signal line RSTO is connected to the junction Jd of the transistors $Tr_{20}$ and $Tr_{25}$, and the pulldown transistor drive control signal line /SEN is connected to the junction /Jd of the transistors $Tr_{21}$ and $Tr_{25}$. The sense amplifier drive circuit 200 further includes a p-channel MOS transistor $Tr_{22}$ which is controlled by the control signal /RSTO, between the junction Jd and the power source (potential Vcc), and n-channel MOS transistors $Tr_{23}$ and $Tr_{24}$ which are controlled by control signals SEN1 and SEN2, respectively, between the junction Jd and ground (potential GND=0). Switching on the transistor $Tr_{22}$ raises the potential of the pullup transistor drive control signal line RSTO to Vcc, while switching on the transistor $Tr_{23}$ or $Tr_{24}$ lowers the potential of the pulldown transistor drive control signal line /SEN to the ground potential.

Figure 18:
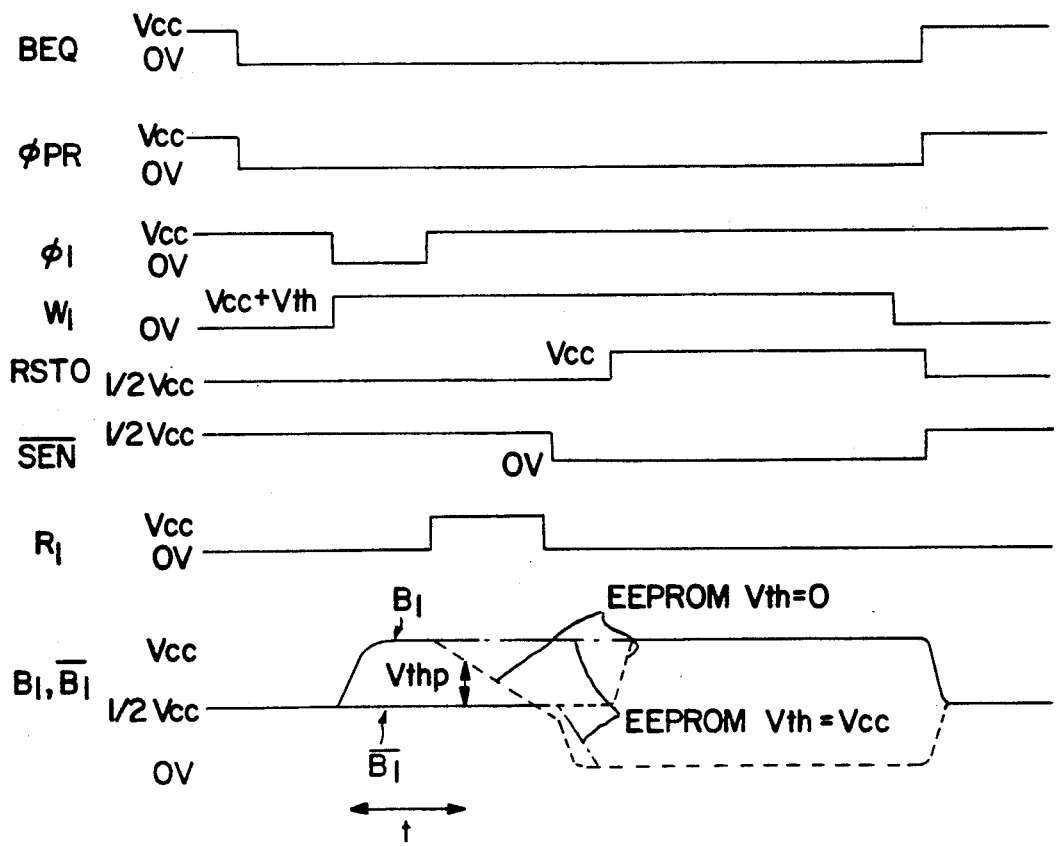
FIG. 18 is a timing chart illustrating the operation of the device of FIG. 15.

When the data stored in the EEPROM section EM is recalled to the DRAM section DM, the following process is performed. First, as shown in FIG. 18, the level of control signals BEQ and $\phi PR$ becomes Vcc. When this happens, the transistors $Tr_{20}$, $Tr_{21}$ and $Tr_{25}$ of the sense amplifier drive circuit 200 and the transistors $Tr_5$, $Tr_7$, ..., $Tr_{13}$ and $Tr_{15}$ of the bit line charging circuit PVG become on, and the pullup transistor drive control signal line RSTO, pulldown transistor drive signal line /SEN and bit line pair $B_1$, $/B_1$, ..., $B_n$, $/B_n$ are set to the intermediate voltage Vcc/2. Here, the memory cell MC, for example, connected to the bit line $B_1$ and the word line $W_1$ is selected. In this case, the level of the control signal $\phi_1$ goes from Vcc to 0, the p-channel MOS transistors $Tr_4$, ..., $Tr_{12}$ connected to the power source become on, and the level of the bit lines $B_1$, ..., $B_n$ is charged to Vcc. At the same time, the word line $W_1$ becomes (Vcc+Vth), and the transistor $Tr_1$ becomes on. The level of the bit lines $/B_1$, ..., $/B_n$ remains at Vcc/2.

When the level of the control signal $\phi_1$ changes from 0 to Vcc upon completion of the charging of each of the bit lines $B_1$, ..., $B_n$, the level of the recall line $R_1$ goes to Vcc and the transistor $Tr_2$ becomes on. When the threshold voltage Vth of the EEPROM section EM (the floating gate transistor MT) of the selected memory cell MC is 0, the charge in the bit line $B_1$ is discharged to ground via the transistors $Tr_1$, $Tr_2$ and MT. Therefore, the potential of the bit line $B_1$ drops as indicated by the broken line in FIG. 18. When the threshold voltage Vth of the EEPROM section EM equals Vcc, however, the potential of the bit line $B_1$ remains at Vcc as indicated by the one-dot dashed line in FIG. 18. After the level of the recall line $R_1$ becomes 0, the level of the pulldown transistor drive control signal line /SEN is pulled down to 0 by the sense amplifier drive circuit 200, while the level of the pullup transistor drive control signal line RSTO is raised to Vcc.

Also, after the predetermined time period has elapsed, the sense amplifier $SA_1$ connected to the bit line pair $B_1$ and $/B_1$ performs sense amplification. Recall operation is performed as described above.

Figure 19:
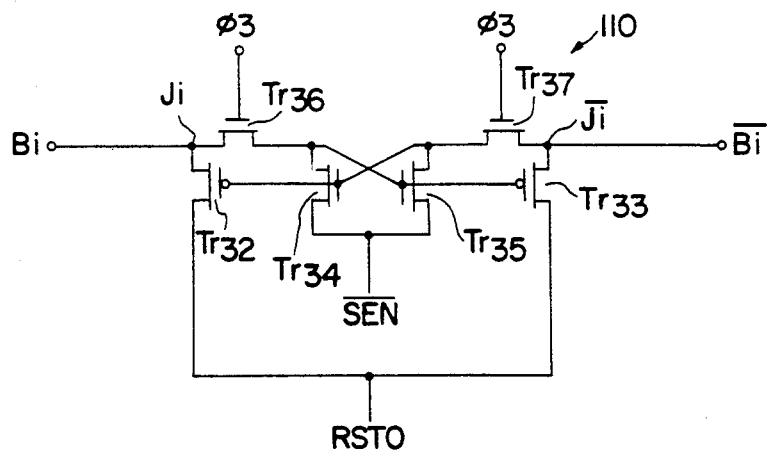
FIG. 19 is a circuit diagram showing another sense amplifier useful in a semiconductor memory device according to the invention.

The sense amplifiers may be constructed as shown in FIG. 19. The sense amplifier 110 shown in FIG. 19 comprises a pair of p-channel MOS transistors $Tr_{32}$ and $Tr_{33}$ which has one terminal connected to the pullup transistor drive control signal line RSTO, a pair of n-channel MOS transistors $Tr_{34}$ and $Tr_{35}$ which has one terminal connected to the pulldown transistor drive control signal line /SEN, and a pair of n-channel MOS transistors $Tr_{36}$ and $TR_{37}$ connected, respectively, between the opposite terminals of the transistors $Tr_{32}$ and $Tr_{34}$ and the opposite terminals of the transistors $Tr_{33}$ and $Tr_{35}$. During recall operation, the transistors $Tr_{36}$ and $Tr_{37}$ are switched off by the control signal $\phi_3$ so that the bit line pair $B_i$, $/B_i$ are electrically separated from the transistors $Tr_{34}$ and $Tr_{35}$.

During recall operation in the semiconductor device of FIG. 15, when the level of the control signal $\phi_1$ is set to 0 and the bit lines $B_1$, ..., $B_n$ are charged to Vcc, the level of the junctions $J_1$, ..., $J_n$ in each of the sense amplifiers shown in FIG. 15 become Vcc. The level of the junctions $/J_1$, ..., $/J_n$, however, remain at Vcc/2, and as described above, the threshold voltage Vthp of each of the p-channel MOS transistors is $0<|Vthp|<Vcc/2$. Therefore, the p-channel MOS transistors $Tr_8$, ..., $Tr_{16}$ in each of the sense amplifiers $SA_1$, ..., $SA_n$ becomes on. That is, each of the bit lines $B_1$, ..., $B_n$ gains continuity with the pullup transistor drive control signal line RSTO (the potential of the pullup transistor drive control signal line RSTO is not controlled at this time and becomes either Vcc/2 or Vcc). Since each of the bit lines $B_1$, ..., $B_n$ are connected through the pullup transistor drive control signal line RSTO in this manner, the load capacitance becomes large when the charge is discharged from one bit line to the source 2 of the EEPROM section EM. As a result, when the EEPROM threshold voltage Vth=0, the time t required for the potential of the bit line to drop from Vcc to (Vcc/2+|Vthp|) becomes longer. Therefore, the semiconductor storage device of FIG. 15 has a drawback that recall operation requires a relatively long period of time as a whole. When the bit line potential drops below (Vcc/2+|Vthp|), the p-channel MOS transistors $Tr_8$, ..., $Tr_{16}$ switch off, so there is no problem.

When the sense amplifier 110 shown in FIG. 19 is used instead of the sense amplifiers $SA_1$, ..., $SA_n$ in FIG. 15, the bit line pairs $B_i$ and $/B_i$ ($i=1, ..., n$) and the pulldown transistor drive control signal line /SEN can be separated by switching off the transistors $Tr_{36}$ and $Tr_{37}$. However, since the bit line pair $B_i$ and $/B_i$ and the pullup transistor drive control signal line RSTO are connected through the p-channel MOS transistors $Tr_{32}$ and $Tr_{33}$, the same problem as that described above results.

Embodiments which can eliminate the above-mentioned drawback will be described.

Figure 16:
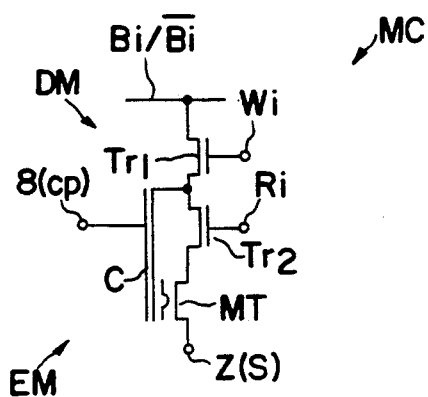
FIG. 16 is a circuit diagram showing a memory cell in the device of FIG. 15.
Figure 20:
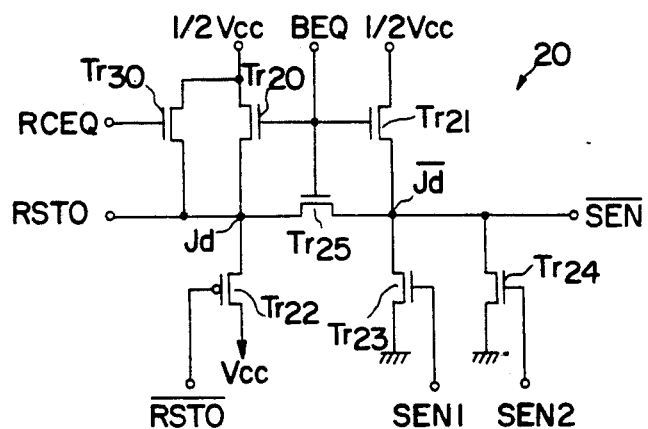
FIGS. 20 to 23 are circuit diagrams showing further sense amplifiers useful in a semiconductor memory device according to the invention.

FIG. 20 shows a sense amplifier drive circuit used in another semiconductor memory device of the invention which comprises the memory cells MC, bit line pairs $B_1$, $/B_1$, ...; $B_n$, $/B_n$, bit line charging circuit PVG and sense amplifiers $SA_1$, ..., $SA_n$ shown in FIGS. 15 and 16. The sense amplifier drive circuit 20 of FIG. 20 comprises three n-channel MOS transistors $Tr_{30}$, $Tr_{20}$ and $Tr_{21}$ which receive the intermediate potential Vcc/2 through one terminal, and an n-channel MOS transistor Tr$_{25}$ connected between the opposite terminals of the transistors Tr$_{30}$ and Tr$_{20}$ and the opposite terminal of the transistor Tr$_{21}$. The control signal RCEQ is supplied to the gate of the transistor Tr$_{30}$, while the same control signal BEQ is supplied to the gates of the transistors Tr$_{20}$, Tr$_{21}$ and Tr$_{25}$. The pullup transistor drive control signal line RSTO is connected to the junction Jd between the transistors Tr$_{30}$ and Tr$_{20}$ and the transistor Tr$_{25}$, while the pulldown transistor drive control signal line /SEN is connected to the junction /Jd between the transistors Tr$_{21}$ and Tr$_{25}$. Therefore, the level of the pullup transistor drive control signal line RSTO can be made Vcc/2 by the control signal RCEQ or BEQ, and the level of the pulldown transistor drive control signal line /SEN can be made Vcc/2 by the control signal BEQ.

The sense amplifier drive circuit 20 further comprises a p-channel MOS transistor Tr$_{22}$ connected between the junction Jd and the power source (potential Vcc) and controlled by the control signal /RSTO, and n-channel MOS transistors Tr$_{23}$ and Tr$_{24}$ connected between the junction /Jd and ground and controlled by the control signals SEN1 and SEN2, respectively. The potential of the pullup transistor drive control signal line RSTO can be raised to Vcc by switching on the transistor Tr$_{22}$, while the potential of the pulldown transistor drive control signal line /SEN can be lowered to ground (=0) by switching on the transistor Tr$_{23}$ or Tr$_{24}$.

Figure 24:
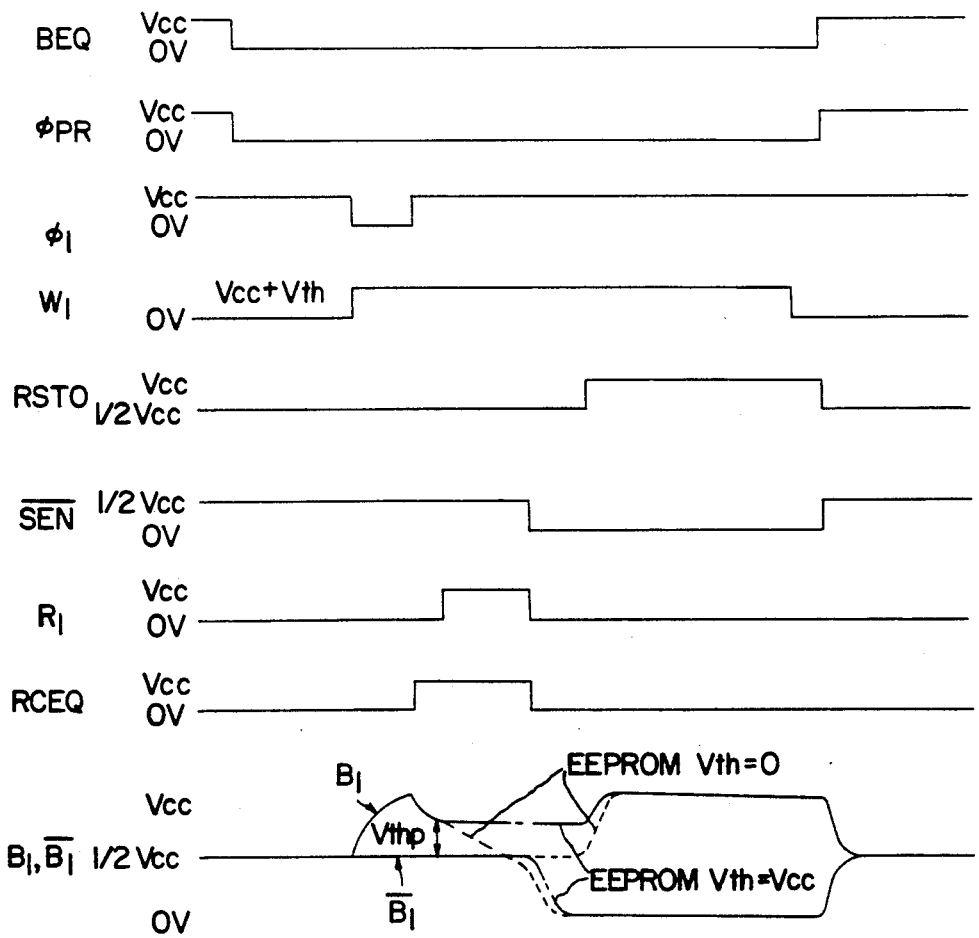
FIGS. 24 and 25a and 25b are timing charts illustrating the operation of a semiconductor memory device according to the invention.

The overall operation of this semiconductor memory device is as follows. First, as shown in FIG. 24, the level of the control signals BEQ and $\phi$PR becomes Vcc. When this happens, the transistors Tr$_{20}$, Tr$_{21}$ and Tr$_{25}$ of the sense amplifier drive circuit 20 and the transistors Tr$_5$, Tr$_7$, ..., Tr$_{13}$ and Tr$_{15}$ of the bit line charging circuit PVG shown in FIG. 15 become on, and the bit line pairs B1, /B$_1$, ..., B$_n$, /B$_n$ are charged to the intermediate potential Vcc/2. At the same time, the sense amplifier drive circuit 20 charges the pullup transistor drive control signal line RSTO to the intermediate potential Vcc/2. Here, it is assumed that the memory cell MC connected to the bit line B$_1$ and the word line W$_1$ is selected. In this case, as shown in FIG. 24, the level of the control signal $\phi_1$ changes from Vcc to 0, thereby the p-channel MOS transistors Tr$_4$, ..., Tr$_{12}$ of the bit line charging circuit PVG are switched on and the bit lines B$_1$, ..., B$_n$ are charged from the intermediate potential Vcc/2 to the power source potential Vcc or a potential near that. In contrast, the bit lines /B$_1$, ..., /B$_n$ remain at the intermediate potential Vcc/2. At the same time, the level of the control signal RCEQ changes from 0 to Vcc, and the transistor Tr$_{30}$ of the sense amplifier drive circuit 20 becomes on. Therefore, the pullup transistor drive control signal line RSTO is maintained at the intermediate potential Vcc/2. By this, the charge at the vicinity of the power source potential Vcc and accumulated in the bit line B$_1$, ..., B$_n$ is quickly discharged to the pullup transistor drive control signal line RSTO via the p-channel MOS transistors Tr$_8$, ..., Tr$_{16}$ in each of the sense amplifiers SA$_1$, ..., SA$_n$. Therefore, as shown in FIG. 24, the potential of the bit lines B$_1$, ..., B$_n$ drops quickly from the power source potential Vcc to a level equal to the intermediate potential Vcc/2 plus the threshold voltage Vthp of the p-channel MOS transistors Tr$_8$, ..., Tr$_{16}$. When the potential of each bit line B$_1$, ..., B$_n$ drops below (Vcc/2 + |Vthp|), the p-channel MOS transistors Tr$_8$, ..., Tr$_{16}$ become off, and hence each of the bit lines B$_1$, ..., B$_n$ and the pullup transistor drive control signal line RSTO become electrically separated. Therefore, when the threshold voltage Vth of the EEPROM section EM of the selected memory cell MC is 0, a charge equivalent to that of one bit line is pulled toward the source 2 of the EEPROM section EM. After a time period sufficient to pull the charge of one bit line has elapsed, the sense amplifiers SA$_1$, ..., SA$_n$ perform sense amplification in the same manner as described above with regard to the memory device of FIG. 15.

Since this semiconductor memory device maintains the potential of the pullup transistor drive control signal line RSTO at the intermediate potential Vcc/2 by the sense amplifier drive circuit 20 during recall operation in this way, each of the bit lines B$_1$, ..., B$_n$ can be quickly dropped from the potential they were charged at to a low potential, and they can be electrically separated. Therefore, the period of recall operation can be shortened.

Figure 21:
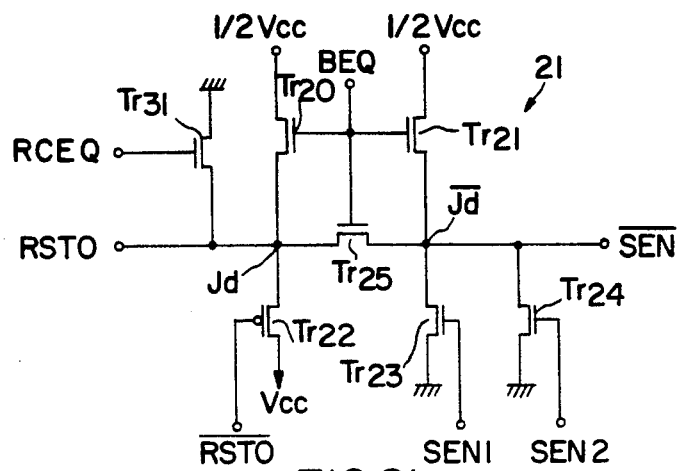

A sense amplifier drive circuit 21 shown in FIG. 21 can be used in place of the sense amplifier drive circuit 20. In place of the n-channel MOS transistor T$_{r30}$ in the sense amplifier drive circuit 20, the sense amplifier drive circuit 21 uses an n-channel MOS transistor Tr$_{31}$ one terminal of which is grounded. This sense amplifier drive circuit 21 is able to maintain the pullup transistor drive control signal line RSTO at the ground potential GND during recall operation, by means of the control signal RCEQ. Therefore, the bit line to which the selected memory cell MC is connected can be quickly changed to the potential level (Vcc/2 + |Vthp|), whereby the period of recall operation can be shortened.

Figure 22:
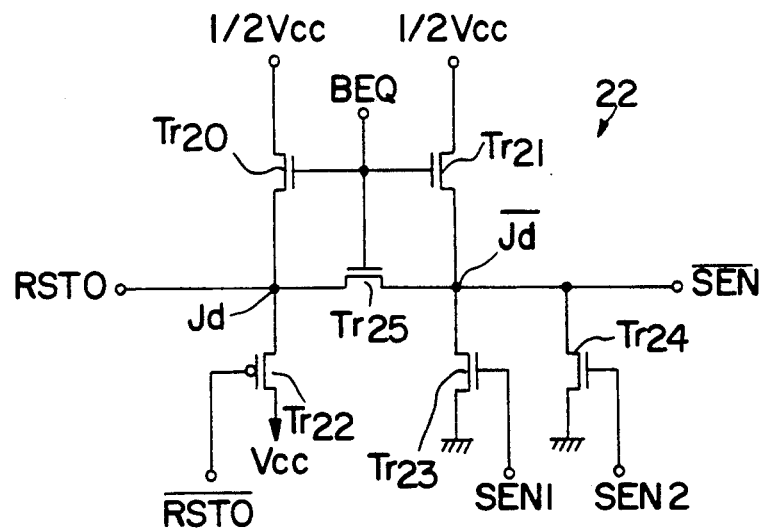
Figure 23:
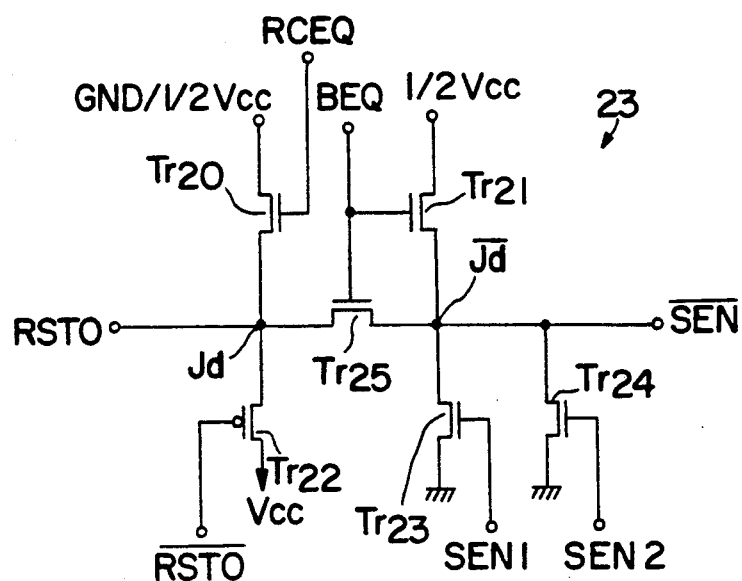
Figure 25A:
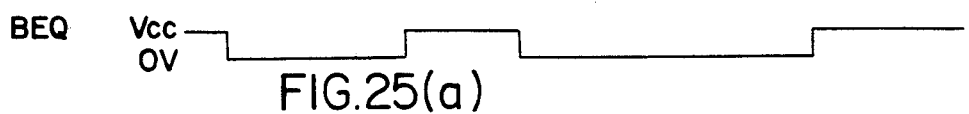
Figure 25B:
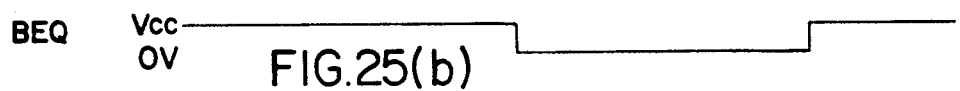

Further, as shown in FIG. 22, a sense amplifier drive circuit 22 without the n-channel MOS transistor Tr$_{30}$ or Tr$_{31}$ can be used, and the control signal BEQ for the transistors Tr$_{20}$, Tr$_{21}$ and Tr$_{25}$ may be changed according to the timing shown in (a) or (b) of FIG. 25. In this case, both the pullup transistor drive control signal line RSTO and the pulldown transistor drive control signal line /SEN can be charged to the Vcc/2 level before recall operation, and they can also be maintained at the Vcc/2 level during recall operation. Therefore, as described above, the level of the bit line to which the selected memory cell MC is connected can be quickly charged to the potential (Vcc/2 + |Vthp|), whereby the period of recall operation can be shortened. Alternatively, as shown in FIG. 23, the gate of the n-channel MOS transistor Tr$_{20}$ may be separated from the gates of the transistors Tr$_{21}$ and Tr$_{25}$ so that the control signal RCEQ can be applied to the transistor Tr$_{20}$ independently. The control signal RCEQ may be changed according to the timing shown in FIG. 24. In this case, the level of the pullup transistor drive control signal line RSTO is charged to Vcc/2 before recall operation through the transistors Tr$_{21}$ and Tr$_{25}$, and during recall operation it is maintained at the Vcc/2 level via the transistor Tr$_{20}$. Therefore, as described above, the level of the bit line to which the selected memory cell MC is connected can be quickly charged to (Vcc/2 + |Vthp|), and the period of recall operation can be shortened.

In this embodiment, the pullup transistor drive control signal line is maintained at the intermediate potential Vcc/2 or ground potential GND, but the invention is not limited to this, and alternatively it may be maintained at a level somewhere between Vcc/2 and GND.

Figure 26:
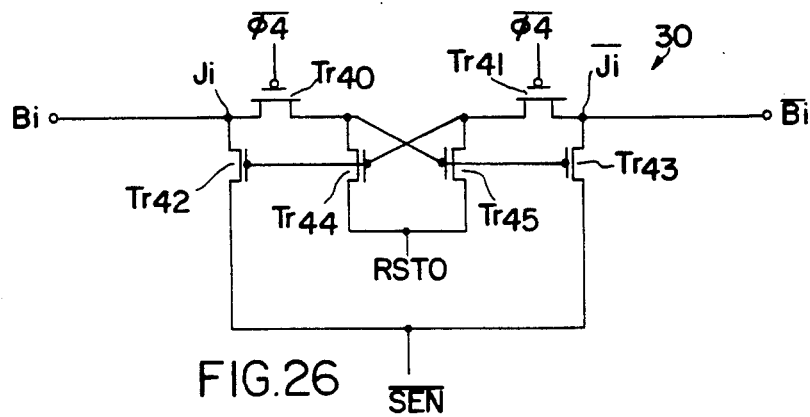
FIG. 26 is a circuit diagram showing an sense amplifier of a semiconductor memory device according to the invention.

A further embodiment of the invention will be described. FIG. 26 shows a sense amplifier drive circuit 200 used in a semiconductor memory device of the embodiment which comprises the memory cells MC, bit line pairs $B_1, /B_1, \ldots, B_n, /B_n$, bit line charging circuit PVG and sense amplifier drive circuit 200. The sense amplifier 30 of FIG. 26 is provided on each bit line pair as in the device of FIG. 15. Each sense amplifier 30 comprises a pair of p-channel MOS transistors $Tr_{44}$ and $Tr_{45}$ for pullup one terminal of which is connected to the pullup transistor drive control signal line RSTO, and a pair of n-channel MOS transistors $Tr_{42}$ and $Tr_{43}$ for pulldown with one terminal connected to the pulldown transistor drive control signal line /SEN. The p-channel MOS transistor $Tr_{40}$ is connected between the opposite terminals of the transistors $Tr_{42}$ and $Tr_{44}$, while the p-channel MOS transistor $Tr_{41}$ is connected between the opposite terminals of the transistors $Tr_{43}$ and $Tr_{45}$. The gates of the transistors $Tr_{42}$ and $Tr_{44}$ are both connected to the junction of the transistors $Tr_{41}$ and $Tr_{45}$, while the gates of the transistors $Tr_{43}$ and $Tr_{45}$ are both connected to junction of the transistors $Tr_{40}$ and $Tr_{44}$. The bit line $B_i (i=1, \ldots, n)$ is connected to junction $J_i$ of the transistors $Tr_{40}$ and $Tr_{42}$, while the bit line $/B_i$ which is mated with the bit line $B_i$ is connected to the junction $/J_i$ of the transistors $Tr_{41}$ and $Tr_{43}$.

Figure 27:
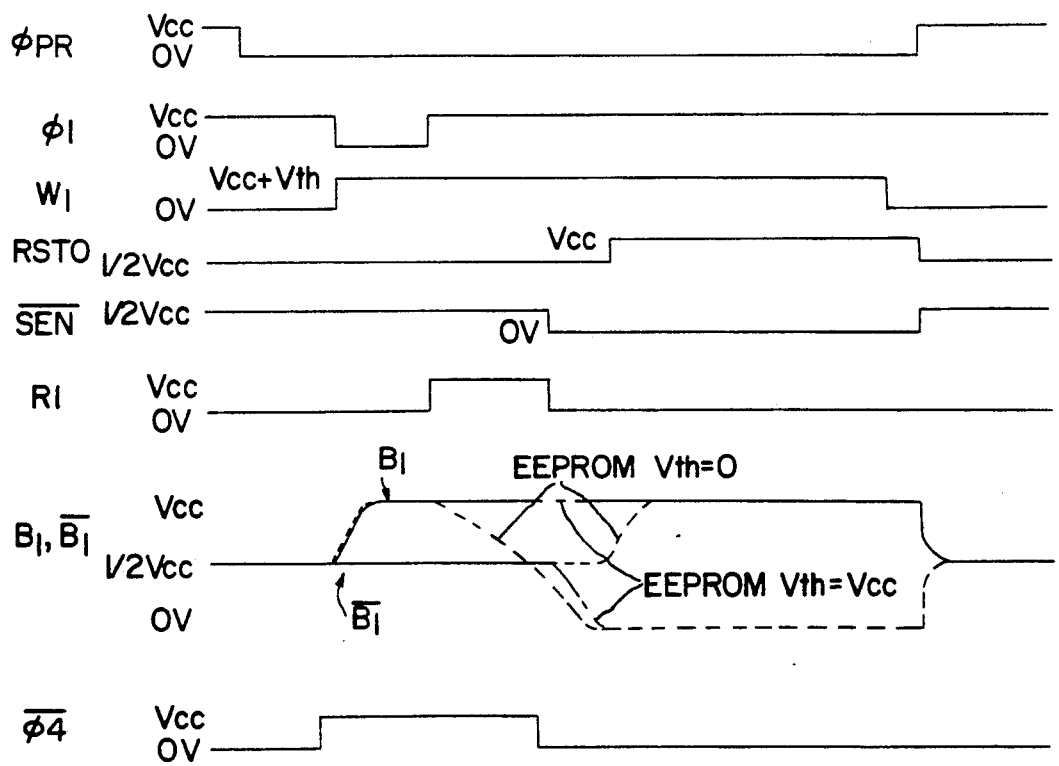
FIG. 27 is a timing chart illustrating the operation of the device shown in FIG. 26.
Figure 29:
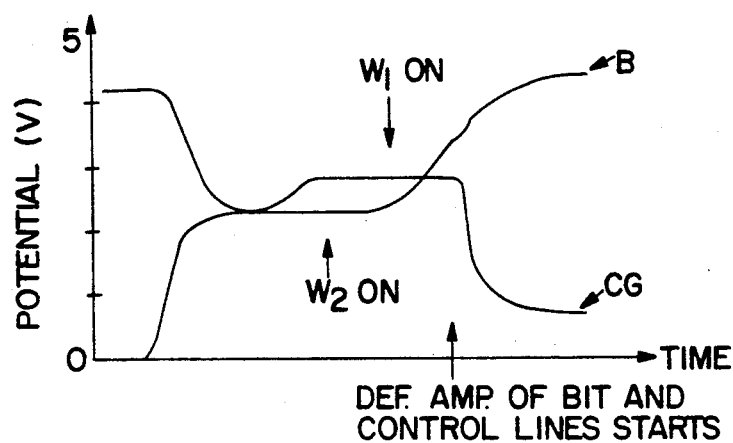
FIG. 29 is a diagram illustrating the waveforms in the device of FIG. 28.
Figure 28:
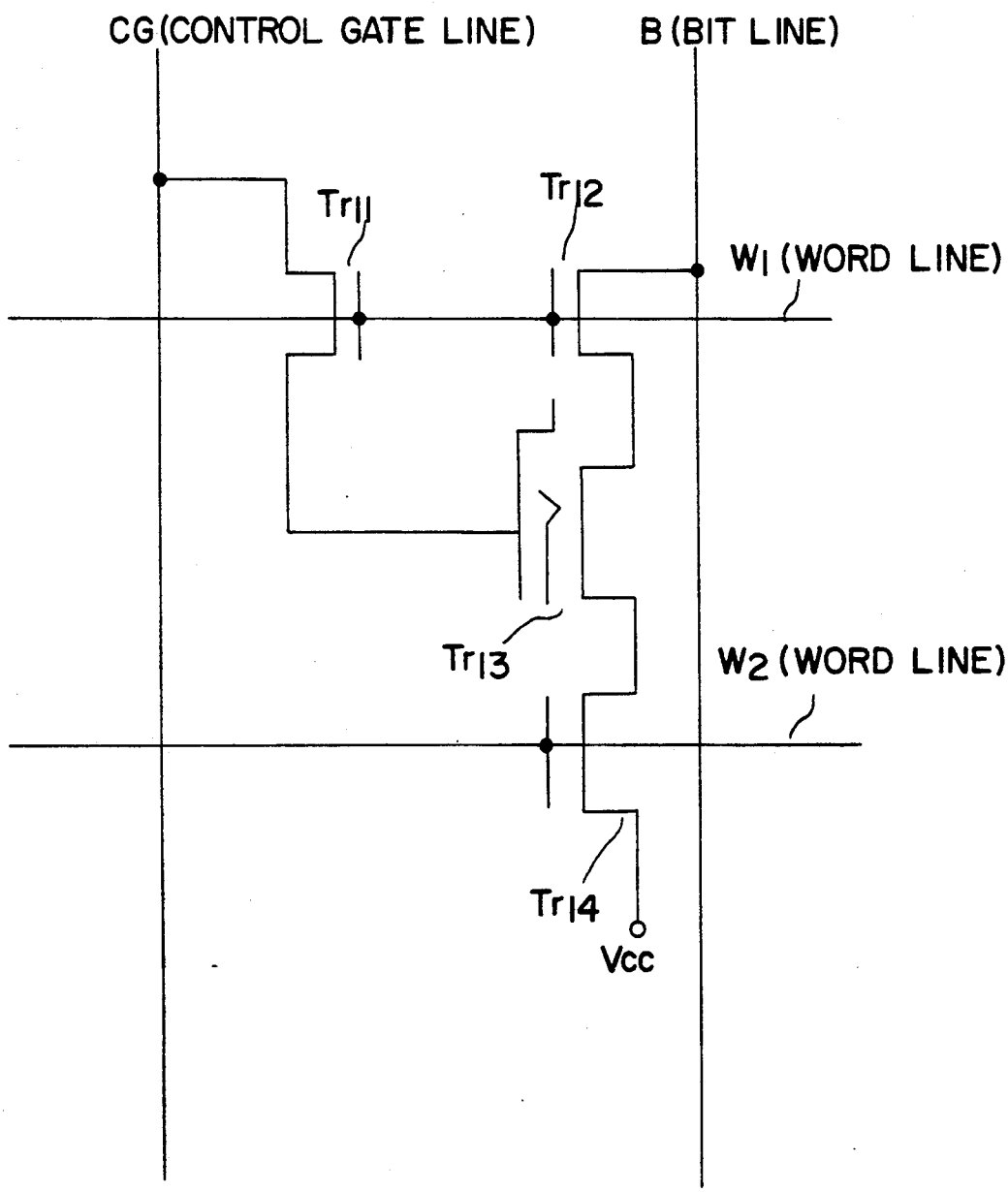
FIG. 28 is a circuit diagram showing a conventional semiconductor memory device.

The operation of this semiconductor memory device is as follows. First, as shown in FIG. 27, the control signal $\phi PR$ become Vcc level, and the transistors $Tr_5$, $Tr_7, \ldots, Tr_{13}$ and $Tr_{15}$ of the bit line charging circuit PVG shown in FIG. 15 become on so that the bit line pairs $B_1, /B_1, \ldots, B_n, /B_n$ are charged to the intermediate potential. As this occurs, the sense amplifier drive circuit 200 charges the pullup transistor drive control signal line RSTO and the pulldown transistor drive control signal line /SEN to the intermediate potential Vcc/2 via the control signal BEQ (not shown), as in the device of FIG. 15. After charging, the transistors $Tr_{20}$ and $Tr_{21}$ of the sense amplifier drive circuit 200 switch off. Next, the control signal $/\phi_4$ changes from zero level to Vcc level, and the p-channel MOS transistors $Tr_{40}$ and $Tr_{41}$ for separation of the sense amplifier 30 become off. Here, when the memory cell MC connected to the bit line $B_1$ and the word line $W_1$ is selected, the control signal $\phi_1$ goes from Vcc level to 0 level as shown in FIG. 27, thereby the p-channel MOS transistors $Tr_4, \ldots, Tr_{12}$ of the bit line charging circuit PVG are switched on and the bit lines $B_1, \ldots, B_n$ are charged so that they go from the intermediate potential Vcc/2 to the power source potential Vcc. At this time, the p-channel MOS transistors $Tr_{40}$ and $Tr_{41}$ for separation are off, and hence the bit lines $B_1, \ldots, B_n$ and the p-channel MOS transistors $Tr_{44}$ and $Tr_{45}$ for pullup in the sense amplifiers 30 become electrically separated, but the bit lines and n-channel MOS transistors for pulldown in the sense amplifier remain connected. However, since this transistor for pulldown is of the n-channel type, it switches off when the potential of the bit lines $B_1, \ldots, B_n$ rises above the intermediate potential Vcc/2. Therefore, the bit lines $B_1, \ldots, B_n$ become electrically separate from the pullup transistor drive control signal line RSTO and the pulldown transistor drive control signal line /SEN. In this state, the control signal $R_1$ goes from 0 level to Vcc level, and the transistor $Tr_2$ for transfer of the selected memory cell MC becomes on. When the threshold voltage Vth of the EEPROM section EM of the selected memory cell MC is 0 level, a charge equal to that of one bit line is pulled toward the source 2 of the EEPROM section EM. After a time period sufficient to pull the charge of one bit line has elapsed, the control signal $/\phi_4$ goes from Vcc level to zero level. This causes the p-channel MOS transistors $Tr_{40}$ and $Tr_{41}$ for separation to switch on, and as in the device of FIG. 15, the sense amplifier 30 performs sense amplification.

Since the p-channel MOS transistors $Tr_{40}$ and $Tr_{41}$ for separation in the sense amplifier 30 are switched off during recall operation in this manner, the bit lines $B_1, \ldots, B_n$ can be electrically separated from the pullup transistor drive control signal line RSTO and the pulldown transistor drive control signal line /SEN. That is, each bit line $B_1, \ldots, B_n$ can be electrically separated. Therefore, the period of recall operation can be shortened.

To simplify the description here, the threshold voltage Vth of the EEPROM section was Vcc at a high state and O at a low state, but in actual practice it may be sufficient that Vth (high)>Vcc/2>Vth (low).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device comprising a volatile memory means and a non-volatile memory means, said volatile memory means comprises a MOS transistor, and a capacitor means, one electrode of said capacitor means being connected to the source of said MOS transistor, said non-volatile memory means comprises a floating gate transistor, said semiconductor memory device further comprises a switch means connected between said source of said MOS transistor and the source/drain of said floating gate transistor, the control gate of said floating gate transistor being connected to said source of said MOS transistor.

2. A method of rewriting data in a semiconductor memory device of the type defined in claim 1, the method comprising the steps of:

(a) setting the MOS transistor and the switch means of the memory device to an off condition;

(b) in the case that data stored in the volatile memory means is "0", changing the threshold voltage to a low state when the threshold voltage of said floating gate transistor is in a high state, and maintaining the high state of the threshold voltage when the threshold voltage of said floating gate transistor is in a low state; and (c) in the case that data stored in said volatile memory means is "1", changing the threshold voltage to a high state when the threshold voltage of said floating gate transistor is in a low state, and maintaining the low state of the threshold voltage when the threshold voltage of said floating gate transistor is in a high state.

3. A method according to claim 2, wherein, in said step (b), a pulse voltage is applied between the other electrode of said capacitor means and the other source/drain of said floating gate transistor, thereby making the potential level of said other source/drain higher than that of said other electrode.

4. A method according to claim 2, wherein, in said step (c), a pulse voltage is applied between the other electrode of said capacitor means and the other source/drain of said floating gate transistor, thereby making the potential level of said other source/drain lower than that of said other electrode.

5. A method of recalling data stored in a semiconductor memory device of the type defined in claim 1, comprising the steps of:
  (a) setting the conduction state of said floating gate transistor in accordance with a minimum threshold voltage necessary to power said floating gate transistor; and
  (b) returning data which has been written in said non-volatile memory means to said volatile memory means depending on the conduction state of said floating gate transistor.

6. A method according to claim 5, wherein, in said step (a), when the threshold voltage of said floating gate transistor is lower than the potential of said control gate, the conduction state of said floating gate transistor is set to be conductive, and when the threshold voltage of said floating gate transistor is higher than the potential of said control gate, the conduction state of said floating gate transistor is set to be nonconductive.

7. A method according to claim 5, wherein, in said step (b), at least one of said MOS transistor and said switch means is set to an off condition, thereby eliminating a DC path from the drain of said MOS transistor.

8. A semiconductor memory device comprising:
  a plurality of memory cells each of which including volatile memory means having a capacitor means, non-volatile memory means having a floating gate transistor, and switch means for transferring data between said volatile memory means and said non-volatile memory means; and a plurality of bit lines to which said memory cells are connected; a plurality of word lines which function as word electrodes common to said memory cells,
  the control gate of said floating gate transistor being connected to the electrode of said capacitor means, said electrode being connected to said switch means,
  said device further comprising:
  means for setting a voltage potential of a power source of said floating gate transistor to ground level when data stored in said non-volatile memory means is to be transferred to said volatile memory means; and
  means for setting the potential of one of said bit lines forming a bit line pair to which one the selected memory cell is connected to the power source level when data stored in said non-volatile memory means is to be transferred to said volatile memory means, and, after setting the potential of the other bit line to an intermediate potential, connecting said non-volatile memory means to said bit line, and thereafter, electrically separating said non-volatile memory means from said bit line, and amplifying the potential difference between said bit line pair.

9. A semiconductor memory device according to claim 8, wherein said control gate and said electrode are made of polysilicon.

10. In a semiconductor memory device comprising: a plurality of memory cells each of which including volatile memory means having a capacitor means, non-volatile memory means having a floating gate transistor, and switch means for transferring data between said volatile memory means and said non-volatile memory means; and a plurality of bit lines to which said memory cells are connected; a plurality of word lines portions of which function as word electrodes common to said memory cells,
  the control gate of said floating gate transistor being connected to an electrode of said capacitor means, said electrode being connected to said switch means,
  said device further comprising:
  means for setting a voltage potential of a power source of said floating gate transistor to a ground level when data stored in said non-volatile memory means is to be transferred to said volatile memory means; and
  a means for setting a potential of all of said volatile means to the power source level when data stored in said non-volatile memory means is to be transferred to said volatile memory means, and thereafter setting said switch means to an on condition.

11. A semiconductor memory device according to claim 10, wherein said control gate and said electrode are made of polysilicon.

12. A semiconductor memory device comprising:
  memory cells having volatile memory means, non-volatile memory means and switch means said switch means being conductive during recall operation;
  bit line pairs connected to said memory cells;
  a pullup transistor drive control signal line;
  sense amplifiers having a p-channel MOS transistor connected between said bit line pairs and said pullup transistor drive control signal line;
  a bit line charging circuit for, before recall operation, charging said bit line pairs to an intermediate potential which is between a power source level and ground level, and thereafter charging the bit line to which the selected memory cell is connected to the power source level; and
  a sense amplifier drive circuit for lowering the potential of said bit line from the power source level to the intermediate potential plus the threshold voltage of said p-channel MOS transistor.

13. A semiconductor memory device according to claim 12, wherein said sense amplifier drive circuit, before recall operation, charges said pullup transistor drive control signal line to the intermediate potential, and maintains the potential of said pullup transistor drive control signal line at the intermediate potential thereof, thereby discharging electric charge of said bit line charged to the power source level, to said pullup transistor drive control signal line via said p-channel MOS transistor.

14. A semiconductor memory device according to claim 12, wherein said device performs a memory recall operation when each of said bit lines are electrically separated from said pullup transistor drive control signal line.

15. A semiconductor memory device comprising:
  memory cells having a volatile memory means, a non-volatile memory means and a switch means which is conductive during a memory recall operation;
  bit line pairs connected to said memory cells;
  a pullup transistor drive control signal line;

a pulldown transistor drive control signal line;

a sense amplifier drive circuit for, before recall operation, charging said pullup transistor drive control signal line and said pulldown transistor drive control signal line to an intermediate potential; and a bit line charging circuit for, before recall operation, charging said bit line pairs to an intermediate potential which is between a power source level and the ground level, and thereafter charging the bit line to which the selected memory cell is connected to the power source level; and sense amplifiers having: a pair of pullup p-channel MOS transistors one terminal of which is connected to said pullup transistor drive control signal line; a pair of pulldown n-channel MOS transistors one terminal of which is connected to said pulldown transistor drive control signal line; and a pair of separation p-channel MOS transistors which is connected between other terminals of said pullup transistor drive control signal line and pulldown transistor drive control signal line, the junctions of said separation p-channel MOS transistors and pulldown n-channel MOS transistors being respectively connected to said bit line pairs.

16. A semiconductor memory device according to claim 15, wherein, before recall operation, said bit line charging circuit charges said bit line pairs to the intermediate potential, and thereafter charges the bit line to which the selected memory cell is connected to the power source level while said separation p-channel MOS transistors are in the off state, and then recall operation starts.

17. A semiconductor memory device according to claim 8 wherein said control gate and said capacitor means comprise a single layer connected to said switch means.

18. A semiconductor memory device according to claim 10 wherein said control gate of said floating gate transistor is connected to said electrode of said capacitor means in a single layer which is connected to said switch means.

* * * * *